(12) United States Patent
Nagai et al.

(10) Patent No.: US 9,818,489 B2
(45) Date of Patent: Nov. 14, 2017

(54) SEMICONDUCTOR MEMORY DEVICE

(71) Applicant: Renesas Electronics Corporation, Koutou-ku, Tokyo (JP)

(72) Inventors: Yoshihiro Nagai, Tokyo (JP); Masami Hanyu, Tokyo (JP); Yuka Suzuki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/424,810

(22) Filed: Feb. 4, 2017

(65) Prior Publication Data
US 2017/0278578 A1 Sep. 28, 2017

(30) Foreign Application Priority Data

Mar. 25, 2016 (JP) .................. 2016-061609

(51) Int. Cl.
| | | |
|---|---|---|
| *G11C 16/34* | (2006.01) | |
| *G11C 16/10* | (2006.01) | |
| *G11C 16/28* | (2006.01) | |
| *G11C 16/14* | (2006.01) | |
| G11C 16/06 | (2006.01) | |

(52) U.S. Cl.
CPC .......... *G11C 16/3427* (2013.01); *G11C 16/10* (2013.01); *G11C 16/14* (2013.01); *G11C 16/28* (2013.01); *G11C 16/06* (2013.01)

(58) Field of Classification Search
CPC . G11C 16/0466; G11C 16/0483; G11C 16/06; G11C 16/08; G11C 16/10; G11C 16/12; G11C 16/14; G11C 16/24; G11C 16/26; G11C 16/28; G11C 16/30; G11C 16/349; G11C 16/3427

USPC .......... 365/185.02, 185.17, 185.18, 185.23, 365/185.28
See application file for complete search history.

(56) References Cited

U.S. PATENT DOCUMENTS

| | | |
|---|---|---|
| 7,385,856 B2 | 6/2008 | Oga et al. |
| 8,514,632 B2 | 8/2013 | Takahashi et al. |
| 2010/0080066 A1* | 4/2010 | Watanabe .......... G11C 16/0433 365/185.23 |
| 2011/0068179 A1* | 3/2011 | Lo Giudice ........ G11C 16/0433 235/492 |

(Continued)

FOREIGN PATENT DOCUMENTS

| | | |
|---|---|---|
| JP | 2005-276347 A | 10/2005 |
| JP | 2011-170941 A | 9/2011 |

*Primary Examiner* — Tan T. Nguyen
(74) *Attorney, Agent, or Firm* — Shapiro, Gabor and Rosenberger, PLLC

(57) ABSTRACT

A semiconductor memory device according to the present invention includes a first memory cell, a second memory cell, a dummy transistor, and a voltage control circuit. The first memory cell has a first transistor that is coupled to a first word line, a first source line, and a bit line. The second memory cell has a second transistor that is coupled to a second word line, a second source line, and the bit line. The dummy transistor has the same structure as the first transistor and is coupled to a dummy word line, a dummy source line, and a dummy bit line. When a predetermined voltage for writing data into the first memory cell is to be applied to the first word line, the voltage control circuit couples the dummy bit line to the second source line and applies the predetermined voltage to the first dummy word line.

10 Claims, 21 Drawing Sheets

(56) References Cited

U.S. PATENT DOCUMENTS

2011/0205808 A1* 8/2011 Takahashi .......... G11C 16/0433
  365/185.23
2012/0063223 A1* 3/2012 Lee .................... G11C 16/0433
  365/185.02

* cited by examiner

SEMICONDUCTOR MEMORY DEVICE

CROSS-REFERENCE TO RELATED APPLICATIONS

The disclosure of Japanese Patent Application No. 2016-061609 filed on Mar. 25, 2016 including the specification, drawings, and abstract is incorporated herein by reference in its entirety.

BACKGROUND

The present invention relates to a semiconductor memory device. For example, the present invention relates to a technology for eliminating a leak current generated when data is written into a memory cell.

A circuit for performing a write by causing a constant current to flow between the source and drain of a memory cell is disclosed in Japanese Unexamined Patent Application Publication No. 2005-276347. The circuit causes a current source circuit to pass a preset constant current along a path from a selected source line to a selected cell source, a selected cell drain, and a selected bit line by applying a source voltage to the selected source line and applying a gate voltage to a selected word line. In this instance, channel hot electrons, which are generated by the constant current flowing into a selected memory cell, are injected into a floating gate to write data in the selected memory cell.

Meanwhile, a semiconductor memory adapted to eliminate a leak current delivered by an unselected memory cell is disclosed in Japanese Unexamined Patent Application Publication No. 2011-170941. The semiconductor memory locates a source line coupled to a memory cell row including a memory cell into which data is to be programmed, and sets the located source line to a high-level voltage. Further, the semiconductor memory locates a source line coupled to a memory cell row into which data is not to be programmed, and sets the located source line to a voltage that is higher than a low-level voltage of a selected gate line and lower than a high-level voltage of an unselected bit line.

SUMMARY

However, there is a problem where a subthreshold leak current in an unselected memory cell cannot be entirely eliminated when a voltage applied to a source line is excessively lower or excessively higher than a voltage applied to a bit line. Examples where such a problem occurs will now be described with reference to FIGS. 19 to 21. The following description explains about studies conducted by the inventors of the present invention and does not explain about related art.

In the example of FIG. 19, a memory cell in an unselected sector is placed in an erased state, and a voltage of 0 V is applied to a control gate line, a source line, and a word line. The erased state is a state where data "1" is written in a memory cell. When a memory cell in a selected sector is to be written into, it is assumed that a voltage of 10.5 V is applied to a control gate line of the memory cell in the selected sector, and that a voltage of 4.5 V is applied to a source line, and further that a voltage of 1 V is applied to a word line. Here, it is assumed that the threshold voltage of a selection transistor of the memory cell in the selected sector is 0.6 V. In this instance, the threshold voltage is a gate-source voltage (Vgs) that is required for the selection transistor to pass a write current of 1 µA.

In the above instance, the voltage of a bit line is 0.4 V, which is lower than the voltage (1 V) applied to the word line of the memory cell in the selected sector by the threshold voltage (0.6 V) of the selection transistor. In the memory cell in the unselected sector, therefore, the voltage (0.4V) applied to the bit line is higher than the voltage (0 V) applied to the source line. In a memory cell in the erased state, a channel is formed below a floating gate of a memory transistor. Therefore, a subthreshold leak current flows from the bit line toward the source line.

In the above instance, the leak current per bit of memory cell is very small (e.g., in the order of pA). For brevity of explanation, FIG. 19 illustrates an example where there are three sectors having two memory cells. Under normal conditions, however, for example, 1K bits of memory cell is coupled to a bit line. Therefore, the sum of leak currents of all unselected memory cells to be coupled to the bit line is in the order of µA (e.g., 0.2 µA in FIG. 19). The voltage (0.4 V) of the bit line shown in FIG. 19 is a voltage value obtained when there is no leak current. In reality, however, the voltage of the bit line decreases due to a leak current (e.g., decreases to 0.3 V).

In contrast, let us assume that a voltage of 0.1 V is applied to a source line of a memory cell in an unselected sector as illustrated in FIG. 20. However, even when a voltage is applied to a source line as mentioned above, the subthreshold leak current cannot be entirely eliminated if the voltage (0.1 V) applied to the source line is excessively lower than the voltage (0.4 V) applied to the bit line. The voltage (0.4 V) of the bit line shown in FIG. 20 is a voltage value obtained when there is no leak current. In reality, however, the voltage of the bit line decreases due to a leak current (e.g., decreases to 0.35 V).

Meanwhile, let us assume that a voltage of 1.5 V is applied to a source line of a memory cell in an unselected sector as illustrated in FIG. 21. However, when the voltage (1.5 V) applied to the source line is excessively higher than the voltage (0.4 V) applied to the bit line as mentioned above, the subthreshold leak current conversely flows from the source line toward the bit line. The voltage (0.4 V) of the bit line shown in FIG. 21 is a voltage obtained when there is no leak current. In reality, however, the voltage of the bit line increases due to a leak current (e.g., increases to 0.5 V).

Other problems and novel features will become apparent from the following description and from the accompanying drawings.

When a predetermined voltage for writing data into a first memory cell is to be applied to a word line to be coupled to the first memory cell, a semiconductor memory device according to an aspect of the present invention couples a dummy bit line, which is to be coupled to a dummy transistor, to a source line, which is to be coupled to a second memory cell, and applies the predetermined voltage to a dummy word line of the dummy transistor.

The above aspect of the present invention makes it possible to eliminate a leak current.

BRIEF DESCRIPTION OF THE DRAWINGS

Embodiments of the present invention will be described in detail based on the following figures, in which.

DETAILED DESCRIPTION

Preferred embodiments of the present invention will now be described with reference to the accompanying drawings. For example, numerical values mentioned to describe the following embodiments are merely illustrative to facilitate the understanding of the embodiments and not restrictive unless otherwise stated. For example, voltage values and current values used to illustrate the following embodiments are also not restrictive so that different values may be defined beforehand and used. Further, in the following description and the accompanying drawings, matters obvious to those skilled in the art are omitted or simplified as appropriate for clarity of explanation.

First Embodiment

Configuration of First Embodiment

A first embodiment of the present invention will now be described with reference to the accompanying drawings. First of all, a configuration of a semiconductor memory device 1 according to the first embodiment will be described with reference to FIG. 1. The semiconductor memory device 1 is a non-volatile semiconductor memory device. More specifically, the semiconductor memory device 1 is a non-volatile memory (flash memory).

Figure 1:
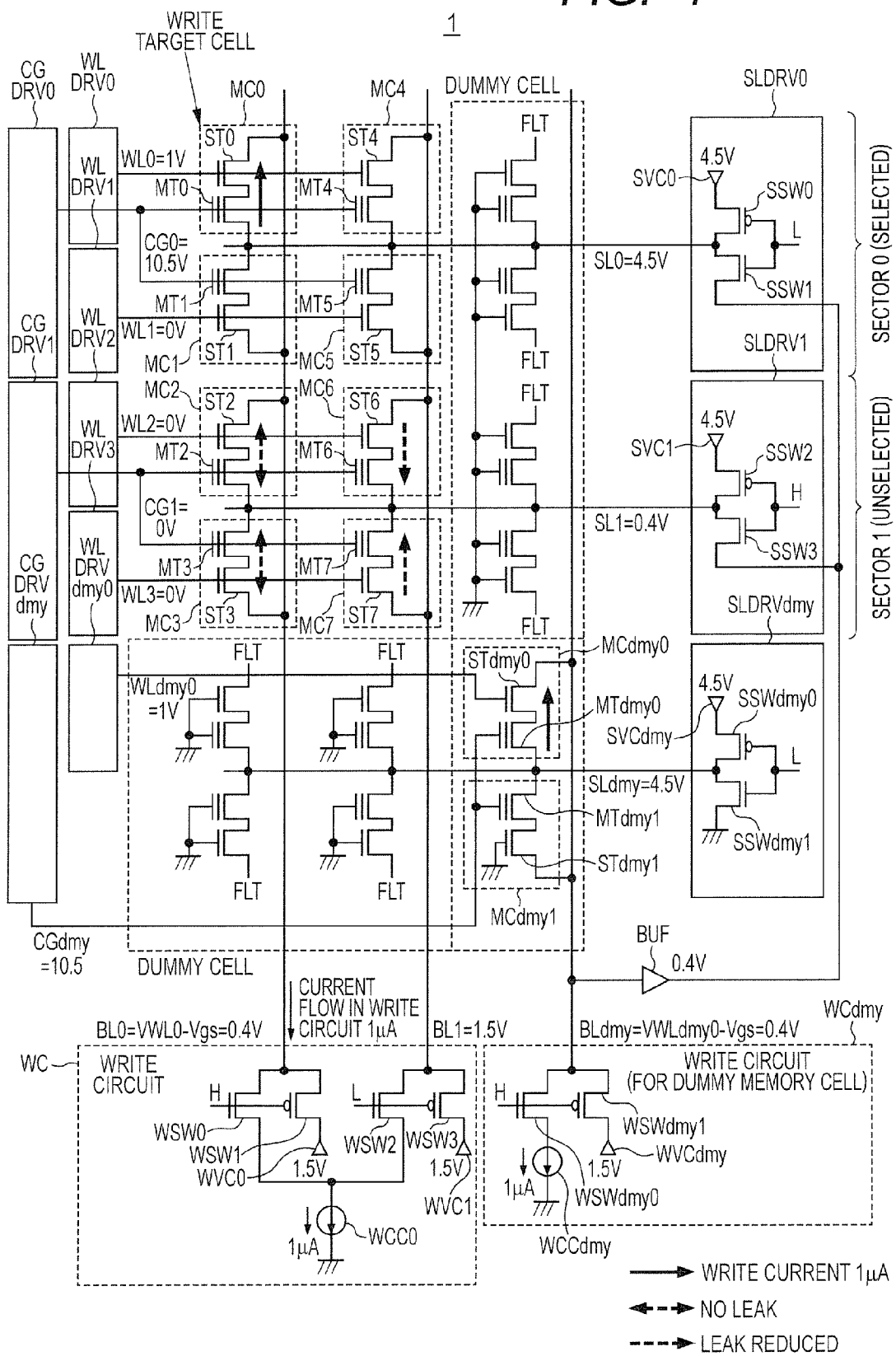
FIG. 1 is a diagram illustrating a configuration of a semiconductor memory device according to a first embodiment of the present invention.

As illustrated in FIG. 1, the semiconductor memory device 1 includes a plurality of memory cells MC0-MC7, a plurality of dummy memory cells MCdmy0, MCdmy1, a plurality of word line drivers WLDRV1-WLDRV3, WLDRVdmy0, a plurality of control gate line drivers CGDRV0, CGDRV1, CGDRVdmy, a plurality of source line drivers SLDRV0, SLDRV1, SLDRVdmy, a plurality of write circuits WC, WCdmy, and a voltage buffer circuit BUF.

Further, the semiconductor memory device 1 includes a plurality of word lines WL0-WL3, a dummy word line WLdmy0, a plurality of control gate lines CG0, CG1, a dummy control gate line CGdmy, a plurality of source lines SL0, SL1, a dummy source line SLdmy, a plurality of bit lines BL0, BL1, and a dummy bit line BLdmy.

A simplified configuration of the semiconductor memory device 1 is illustrated in FIG. 1. In reality, the semiconductor memory device 1 includes many dummy memory cells in addition to the dummy memory cells MCdmy0, MCdmy1 shown in FIG. 1. However, the reference numerals of such additional dummy memory cells are not shown. Further, the semiconductor memory device 1 also includes, in reality, many word lines, control gate lines, source lines, and bit lines other than the above-mentioned ones. However, such additional lines are not shown either. Furthermore, in accordance with the additional memory cells and additional lines, the semiconductor memory device 1 also includes, for example, many more memory cells, dummy memory cells, word line drivers, control gate line drivers, and source line drivers, which are not shown either.

In short, a memory cell array is formed of a plurality of memory cells, including the memory cells MC0-MC7, and a plurality of dummy memory cells, including the dummy memory cells MCdmy0, MCdmy1.

The memory cell MC0 includes a selection transistor ST0 and a memory transistor MT0. When a read or write operation is to be performed, the selection transistor ST0 selects a memory cell from which data is to be read or a memory cell into which data is to be written. The memory transistor MT0 is a transistor for memorizing data. The memory transistor MT0 includes a floating gate and a control gate. The floating gate is used to store electric charge. The control gate is to be coupled to the control gate line CG0. A charge trap film may be used to store electric charge. Meanwhile, the selection transistor ST0 includes a control gate to be coupled to the word line WL0, but does not include a floating gate for storing electric charge. The other memory cells MC1-MC7 have the same structure as the memory cell MC0. That is to say, the memory cells MC1-MC7 each include a respective one of selection transistors ST1-ST7 and a respective one of memory transistors MT1-MT8.

When the following description says that data is written, it means, unless otherwise stated, that data "0" is written into a memory cell.

For purposes of description, the term "row" is defined as the horizontal direction in FIG. 1, and the term "column" is defined as the vertical direction in FIG. 1. Within the memory cell array, the memory cells MC0-MC3 are in the same column, and the memory cells MC4-MC7 are in the same column. Further, within the memory cell array, the memory cells MC0, MC4 are in the same row, the memory cells MC1, MC5 are in the same row, the memory cells MC2, MC6 are in the same row, and the memory cells MC3, MC7 are in the same row.

Memory cells in the same row are coupled to the same word line. Memory cells in the same odd-numbered row and memory cells in the same even-numbered subsequent row are coupled to the same control gate line and to the same source line. Memory cells in the same column are coupled to the same bit line.

More specifically, the first terminals of the memory transistors MT0, MT1, MT4, MT5 in the memory cells MC0, MC1, MC4, MC5 are coupled to the control gate line CG0. The first terminals of the memory transistors MT2, MT3, MT6, MT7 in the memory cells MC2, MC3, MC6, MC7 are coupled to the control gate line CG1.

The first terminals of the selection transistors ST0, ST4 in the memory cells MC0, MC4 are coupled to the word line WL0. The first terminals of the selection transistors ST1, ST5 in the memory cells MC1, MC5 are coupled to the word line WL1. The first terminals of the selection transistors ST2, ST6 in the memory cells MC2, MC6 are coupled to the word line WL2. The first terminals of the selection transistors ST3, ST7 in the memory cells MC3, MC7 are coupled to the word line WL3. The first terminals function as a gate (control gate).

The second terminals of the memory transistors MT0, MT1, MT4, MT5 in the memory cells MC0, MC1, MC4, MC5 are coupled to the source line SL0. The second terminals of the memory transistors MT2, MT3, MT6, MT7 in the memory cells MC2, MC3, MC6, MC7 are coupled to the source line SL1.

The second terminals of the selection transistors ST0, ST1, ST4, ST5 in the memory cells MC0, MC1, MC4, MC5 are coupled to the source line SL0 through the memory transistors MT0, MT1, MT4, MT5, respectively. The second terminals of the selection transistors ST2, ST3, ST6, ST7 in the memory cells MC2, MC3, MC6, MC7 are coupled to the source line SL1 through the memory transistors MT2, MT3, MT6, MT7, respectively.

The third terminals of the selection transistors ST0-ST3 in the memory cells MC0-MC3 are coupled to the bit line BL0. The third terminals of the selection transistors ST4-ST7 in the memory cells MC4-MC7 are coupled to the bit line BL1.

The third terminals of the memory transistors MT0-MT3 in the memory cells MC0-MC3 are coupled to the bit line BL0 through the selection transistors ST0-ST3, respectively. The third terminals of the memory transistors MT4-MT7 in the memory cells MC4-MC7 are coupled to the bit line BL1 through the selection transistors ST4-ST7, respectively.

That is to say, the second terminals of the selection transistors ST0-ST7 are coupled to the third terminals of the memory transistors MT0-MT7, respectively. The second and third terminals function as a source or a drain. During a write operation, for example, the voltage of the source line is higher that the voltage of the bit line. Thus, the second terminal functions as a drain, and the third terminal functions as a source. During a read operation, however, the voltage of the bit line is higher than the voltage of the source line. Thus, the second terminal functions as a source, and the third terminal functions as a drain.

Here, the semiconductor memory device 1 includes a plurality of sectors. In the example of FIG. 1, a first sector ("sector 0" in FIG. 1) includes the memory cells MC0, MC1, MC4, MC5. A second sector ("sector 1" in FIG. 1) includes the memory cells MC2, MC3, MC6, MC7.

The word line driver WLDRV0 is coupled to the word line WL0. When writing data into either of the memory cells MC0, MC4 coupled to the word line WL0, the word line driver WLDRV0 applies a high-level voltage (1 V) to the word line WL0. Meanwhile, when writing data into neither of the memory cells MC0, MC4 coupled to the word line WL0, the word line driver WLDRV0 applies a low-level voltage (0 V) to the word line WL0. When the description says a "high-level voltage" and a "low-level voltage" with respect to the same circuit in the above manner, the "high-level voltage" means a first voltage, and the "low-level voltage" means a second voltage. The second voltage is lower than the first voltage. The same holds true for the subsequent description.

The word line driver WLDRV1 is coupled to the word line WL1. When writing data into either of the memory cells MC1, MC5 coupled to the word line WL1, the word line driver WLDRV1 applies a high-level voltage (1 V) to the word line WL1. Meanwhile, when writing data into neither of the memory cells MC1, MC5 coupled to the word line WL1, the word line driver WLDRV1 applies a low-level voltage (0 V) to the word line WL1.

The word line driver WLDRV2 is coupled to the word line WL2. When writing data into either of the memory cells MC2, MC6 coupled to the word line WL2, the word line driver WLDRV2 applies a high-level voltage (1 V) to the word line WL2. Meanwhile, when writing data into neither of the memory cells MC2, MC6 coupled to the word line WL2, the word line driver WLDRV2 applies a low-level voltage (0 V) to the word line WL2.

The word line driver WLDRV3 is coupled to the word line WL3. When writing data into either of the memory cells MC3, MC7 coupled to the word line WL3, the word line driver WLDRV3 applies a high-level voltage (1 V) to the word line WL3. Meanwhile, when writing data into neither of the memory cells MC3, MC7 coupled to the word line WL3, the word line driver WLDRV3 applies a low-level voltage (0 V) to the word line WL3.

The control gate line driver CGDRV0 is coupled to the control gate line CG0. When writing data into one of the memory cells MC0, MC1, MC4, MC5 coupled to the control gate line CG0, the control gate line driver CGDRV0 applies a high-level voltage (10.5V) to the control gate line CG0. Meanwhile, when writing data into none of the memory cells MC0, MC1, MC4, MC5 coupled to the control gate line CG0, the control gate line driver CGDRV0 applies a low-level voltage (0 V) to the control gate line CG0.

The control gate line driver CGDRV1 is coupled to the control gate line CG1. When writing data into one of the memory cells MC2, MC3, MC6, MC7 coupled to the control gate line CG1, the control gate line driver CGDRV1 applies a high-level voltage (10.5V) to the control gate line CG1. Meanwhile, when writing data into none of the memory cells MC2, MC3, MC6, MC7 coupled to the control gate line CG1, the control gate line driver CGDRV1 applies a low-level voltage (0 V) to the control gate line CG1.

The source line driver SLDRV0 is coupled to the source line SL0. When writing data into one of the memory cells MC0, MC1, MC4, MC5 coupled to the source line SL0, the source line driver SLDRV0 applies a high-level voltage (4.5 V) to the source line SL0. Meanwhile, when writing data into none of the memory cells MC0, MC1, MC4, MC5 coupled to the source line SL0, the source line driver SLDRV0 applies a low-level voltage (the value of the voltage will be described later) to the source line SL0.

The source line driver SLDRV1 is coupled to the source line SL1. When writing data into one of the memory cells MC2, MC3, MC6, MC7 coupled to the source line SL1, the source line driver SLDRV1 applies a high-level voltage (4.5 V) to the source line SL1. Meanwhile, when writing data into none of the memory cells MC2, MC3, MC6, MC7 coupled to the source line SL1, the source line driver SLDRV1 applies a low-level voltage (the value of the voltage will be described later) to the source line SL1.

The write circuit WC is coupled to the bit lines BL0, BL1. When writing data into one of the memory cells MC0-MC3 coupled to the bit line BL0, the write circuit WC applies, to all the bit lines BL0, BL1, a voltage (1.5V) having a voltage level that does not erroneously write into the memory cells MC0-MC7. Subsequently, when writing data into none of the memory cells MC4-MC7 coupled to the bit line BL1 and writing data into one of the memory cells MC0-MC3 coupled to the bit line BL0, the write circuit WC applies a constant current (1 μA) to the bit line BL0 and continuously applies the above-mentioned voltage to the bit line BL1. Meanwhile, when writing data into none of the memory cells MC0-MC3 coupled to the bit line BL0 and writing data into one of the memory cells MC4-MC7 coupled to the bit line BL1, the write circuit WC applies a constant current (1 μA) to the bit line BL1 and continuously applies the above-mentioned voltage to the bit line BL0.

More specifically, the write circuit WC includes switches WSW0-WSW3, a current source circuit WCC0, and supply voltage circuits WVC0, WVC1. The bit line BL0 is coupled to the current source circuit WCC0 through the switch WSW0, and coupled to the supply voltage circuit WVC0 through the switch WSW1. The bit line BL1 is coupled to the current source circuit WCC0 through the switch WSW2, and coupled to the supply voltage circuit WVC1 through the switch WSW3. The current source circuit WCC0 is coupled to a ground. That is to say, the bit line BL0 is coupled to the ground through the switch WSW0 and the current source circuit WCC0, and the bit line BL1 is coupled to the ground through the switch WSW2 and the current source circuit WCC0.

The switch WSW0 and the switch WSW1 turn on exclusively. That is to say, when applying a constant current to the bit line BL0, the write circuit WC turns on the switch WSW0 and turns off the switch WSW1. This electrically couples the current source circuit WCC0 to the bit line BL0 and electrically uncouples the supply voltage circuit WVC0 from the bit line BL0. Thus, a constant current (1 μA) generated by the current source circuit WCC0 is applied to the bit line BL0. Meanwhile, when applying a voltage to the bit line BL0, the write circuit WC turns off the switch WSW0 and turns on the switch WSW1. This electrically uncouples the current source circuit WCC0 from the bit line BL0 and electrically couples the supply voltage circuit WVC0 to the bit line BL0. Thus, a voltage (1.5 V) generated by the supply voltage circuit WVC1 is applied to the bit line BL0.

For example, the switch WSW0 is an n-type MOS transistor, and the switch WSW1 is a p-type MOS transistor. The switch WSW0 and the switch WSW1 can be turned on exclusively as mentioned above by applying the same gate voltage to the gate of the switch WSW0 and to the gate of the switch WSW1.

The switch WSW2 and the switch WSW3 turn on exclusively. That is to say, when applying a constant current to the bit line BL1, the write circuit WC turns on the switch WSW2 and turns off the switch WSW3. This electrically couples the current source circuit WCC0 to the bit line BL1 and electrically uncouples the supply voltage circuit WVC1 from the bit line BL1. Thus, a constant current (1 μA) generated by the current source circuit WCC0 is applied to the bit line BL1. Meanwhile, when applying a voltage to the bit line BL1, the write circuit WC turns off the switch WSW2 and turns on the switch WSW3. This electrically uncouples the current source circuit WCC0 from the bit line BL1 and electrically couples the supply voltage circuit WVC1 to the bit line BL1. Thus, a voltage (1.5 V) generated by the supply voltage circuit WVC1 is applied to the bit line BL1.

For example, the switch WSW2 is an n-type MOS transistor, and the switch WSW3 is a p-type MOS transistor. The switch WSW2 and the switch WSW3 can be turned on exclusively as mentioned above by applying the same gate voltage to the gate of the switch WSW2 and to the gate of the switch WSW3.

The dummy memory cells MCdmy0, MCdmy1 have the same structure as the memory cells MC0-MC7. That is to say, the dummy memory cell MCdmy0 includes a memory transistor MTdmy0 and a selection transistor STdmy0, and the dummy memory cell MCdmy1 includes a memory transistor MTdmy1 and a selection transistor STdmy1.

Consequently, the memory transistors MT0-MT7, MTdmy0, MTdmy1 have the same structure, and the selection transistors ST0-ST7, STdmy0, STdmy1 have the same structure.

The dummy memory cell MCdmy0 is coupled to the dummy word line WLdmy0, the dummy control gate line CGdmy, the dummy source line SLdmy, and the dummy bit line BLdmy. The dummy memory cell MCdmy1 is coupled to the dummy control gate line CGdmy, the dummy source line SLdmy, and the dummy bit line BLdmy. No dummy word line is coupled to the dummy memory cell MCdmy1.

More specifically, the first terminals of the memory transistors MTdmy0, MTdmy1 in the dummy memory cells MCdmy0, MCdmy1 are coupled to the dummy control gate line CGdmy. The first terminal of the selection transistor STdmy0 in the dummy memory cell MCdmy0 is coupled to the dummy word line WLdmy0. The first terminal of the selection transistor STdmy1 in the dummy memory cell MCdmy1 is coupled to the ground. The first terminals function as a gate (control gate).

The second terminals of the memory transistors MTdmy0, MTdmy1 in the dummy memory cells MCdmy0, MCdmy1 are coupled to the dummy source line SLdmy. The second terminals of the selection transistors STdmy0, STdmy1 in the dummy memory cells MCdmy0, MCdmy1 are coupled to the dummy source line SLdmy through the memory transistors MTdmy0, MTdmy1, respectively.

The third terminals of the memory transistors MTdmy0, MTdmy1 in the dummy memory cells MCdmy0, MCdmy1 are coupled to the dummy bit line BLdmy through the selection transistors STdmy0, STdmy1, respectively. The third terminals of the selection transistors STdmy0, STdmy1 in the dummy memory cells MCdmy0, MCdmy1 are coupled to the dummy bit line BLdmy.

Consequently, the second terminals of the selection transistors STdmy0, STdmy1 are coupled to the third terminals of the memory transistors MTdmy0, MTdmy1, respectively. The second and third terminals function as a source or a drain. For example, when the voltage of the dummy source line SLdmy is higher than the voltage of the dummy bit line BLdmy, the second terminals function as a drain and the third terminals function as a source. Meanwhile, when the voltage of the dummy bit line BLdmy is higher than the voltage of the dummy source line SLdmy, the second terminals function as a source and the third terminals function as a drain.

The word line driver WLDRVdmy0 has the same structure as the word line drivers WLDRV0-WLDRV3. The word line driver WLDRVdmy0 is coupled to the dummy word line WLdmy0. When writing data into one of the memory cells MC0-MC7, the word line driver WLDRVdmy0 applies a high-level voltage (1 V) to the dummy word line WLdmy0. Meanwhile, when writing data into none of the memory cells MC0-MC7, the word line driver WLDRVdmy0 applies a low-level voltage (0 V) to the dummy word line WLdmy0.

The control gate line driver CGDRVdmy has the same structure as the control gate line drivers CGDRV0, CGDRV1. The control gate line driver CGDRVdmy is coupled to the dummy control gate line CGdmy. When writing data into one of the memory cells MC0-MC7, the control gate line driver CGDRVdmy applies a high-level voltage (10.5 V) to the dummy control gate line CGdmy. Meanwhile, when writing data into none of the memory cells MC0-MC7, the control gate line driver CGDRVdmy applies a low-level voltage (0 V) to the dummy control gate line CGdmy.

The source line driver SLDRVdmy has the same structure as the source line drivers SLDRV0, SLDRV1. The source line driver SLDRVdmy is coupled to the dummy source line SLdmy. When writing data into one of the memory cells MC0-MC7, the source line driver SLDRVdmy applies a high-level voltage (4.5 V) to the dummy source line SLdmy. Meanwhile, when writing data into none of the memory cells MC0-MC7, the source line driver SLDRVdmy applies a low-level voltage (0 V) to the dummy source line SLdmy.

More specifically, the source line driver SLDRVdmy includes switches SSWdmy0, SSWdmy1, and a supply voltage circuit SVCdmy. The dummy source line SLdmy is coupled to the supply voltage circuit SVCdmy through the switch SSWdmy0, and coupled to the ground through the switch SSWdmy1.

The switch SSWdmy0 and the switch SSWdmy1 turn on exclusively. That is to say, when applying a high-level voltage to the dummy source line SLdmy, the source line driver SLDRVdmy turns on the switch SSWdmy0 and turns off the switch SSWdmy1. This electrically couples the supply voltage circuit SVCdmy to the dummy source line SLdmy and electrically uncouples the ground from the dummy source line SLdmy. Thus, a high-level voltage (4.5 V) generated by the source voltage circuit SVCdmy is applied to the dummy source line SLdmy. Meanwhile, when applying a low-level voltage to the dummy source line SLdmy, the source line driver SLDRVdmy turns off the switch SSWdmy0 and turns on the switch SSWdmy1. This electrically uncouples the supply voltage circuit SVCdmy from the dummy source line SLdmy and electrically couples the ground to the dummy source line SLdmy. Thus, a low-level voltage (0 V) from the ground is applied to the dummy source line SLdmy.

For example, the switch SSWdmy0 is a p-type MOS transistor, and the switch SSWdmy1 is an n-type MOS transistor. The switch SSWdmy0 and the switch SSWdmy1 can be turned on exclusively as mentioned above by applying the same gate voltage to the gate of the switch SSWdmy0 and to the gate of the switch SSWdmy1.

The write circuit WCdmy is coupled to the dummy bit line BLdmy. When writing data into one of the memory cells MC0-MC7, the write circuit WCdmy applies, to the dummy bit line BLdmy, a voltage (1.5 V) having a voltage level that does not erroneously write into the dummy memory cell MCdmy0. Subsequently, the write circuit WCdmy applies a constant current (1 μA) to the dummy bit line BLdmy.

More specifically, the write circuit WCdmy includes switches SSWdmy0, SSWdmy1, a current source circuit WCCdmy, and a supply voltage circuit WVCdmy. The dummy bit line BLdmy is coupled to the current source circuit WCCdmy through the switch WSWdmy0, and coupled to the supply voltage circuit WVCdmy through the switch WSWdmy1. The current source circuit WCCdmy is coupled to the ground. That is to say, the dummy bit line BLdmy is coupled to the ground through the switch WSWdmy0 and the current source circuit WCCdmy.

The switch WSWdmy0 and the switch WSWdmy1 turn on exclusively. That is to say, when applying a constant current to the dummy bit line BLdmy, the write circuit WCdmy turns on the switch WSWdmy0 and turns off the switch WSWdmy1. This electrically couples the current source circuit WCCdmy to the dummy bit line BLdmy and electrically uncouples the supply voltage circuit WVCdmy from the dummy bit line BLdmy. Thus, a constant current (1 μA) generated by the current source circuit WCCdmy is applied to the dummy bit line BLdmy. Meanwhile, when applying a voltage to the dummy bit line BLdmy, the write circuit WCdmy turns off the switch WSWdmy0 and turns on the switch WSWdmy1. This electrically uncouples the current source circuit WCCdmy from the dummy bit line BLdmy and electrically couples the supply voltage circuit WVCdmy to the dummy bit line BLdmy. Thus, a voltage (1.5 V) generated by the supply voltage circuit WVCdmy is applied to the dummy bit line BLdmy.

For example, the switch WSWdmy0 is an n-type MOS transistor, and the switch WSWdmy1 is a p-type MOS transistor. The switch WSWdmy0 and the switch WSWdmy1 can be turned on exclusively as mentioned above by applying the same gate voltage to the gate of the switch WSWdmy0 and to the gate of the switch WSWdmy1.

Further, the dummy bit line BLdmy is coupled to the source line drivers SLDRV0, SLDRV1 through the voltage buffer circuit BUF. The voltage buffer circuit BUF operates so that a voltage applied from the dummy bit line BLdmy is applied to the source line drivers SLDRV0, SLDRV1, respectively. The voltage buffer circuit BUF is, for example, a voltage follower circuit.

As described above, the voltage of the dummy bit line BLdmy is applied to the source line drivers SLDRV0, SLDRV1. This voltage functions as the above-mentioned "low-level voltage".

More specifically, the source line driver SLDRV0 includes switches SSW0, SSW1 and a supply voltage circuit SVC0. The source line SL0 is coupled to the supply voltage circuit SVC0 through the switch SSW0, and coupled to the voltage buffer circuit BUF through the switch SSW1.

The switch SSW0 and the switch SSW1 turn on exclusively. That is to say, when applying a high-level voltage to the source line SL0, the source line driver SLDRV0 turns on the switch SSW0 and turns off the switch SSW1. This electrically couples the supply voltage circuit SVC0 to the source line SL0 and electrically uncouples the voltage buffer circuit BUF from the source line SL0. Thus, a high-level voltage (4.5 V) generated by the supply voltage circuit SVC0 is applied to the source line SL0. Meanwhile, when applying a low-level voltage to the source line SL0, the source line driver SLDRV0 turns off the switch SSW0 and turns on the switch SSW1. This electrically uncouples the supply voltage circuit SVC0 from the source line SL0 and electrically couples the voltage buffer circuit BUF to the source line SL0. Thus, a low-level voltage (the voltage of the dummy bit line BLdmy) from the voltage buffer circuit BUF is applied to the source line SL0.

For example, the switch SSW0 is a p-type MOS transistor, and the switch SSW1 is an n-type MOS transistor. The switch SSW0 and the switch SSW1 can be turned on exclusively as mentioned above by applying the same gate voltage to the gate of the switch SSW0 and to the gate of the switch SSW1.

Further, the source line driver SLDSRV1 includes switches SSW2, SSW3. The source line SL1 is coupled to a supply voltage circuit SVC1 through the switch SSW2, and coupled to the voltage buffer circuit BUF through the switch SSW3.

The switch SSW2 and the switch SSW3 turn on exclusively. That is to say, when applying a high-level voltage to the source line SL1, the source line driver SLDRV1 turns on the switch SSW2 and turns off the switch SSW3. This electrically couples the supply voltage circuit SVC1 to the source line SL1 and electrically uncouples the voltage buffer circuit BUF from the source line SL1. Thus, a high-level voltage (4.5 V) from the supply voltage circuit SVC1 is applied to the source line SL1. Meanwhile, when applying a low-level voltage to the source line SL1, the source line driver SLDRV1 turns off the switch SSW2 and turns on the switch SSW3. This electrically uncouples the supply voltage circuit SVC1 from the source line SL1 and electrically couples the voltage buffer circuit BUF to the source line SL1. Thus, a low-level voltage (the voltage of the dummy bit line BLdmy) from the voltage buffer circuit BUF is applied to the source line SL1.

For example, the switch SSW2 is a p-type MOS transistor, and the switch SSW3 is an n-type MOS transistor. The switch SSW2 and the switch SSW3 can be turned on exclusively as mentioned above by applying the same gate voltage to the gate of the switch SSW2 and to the gate of the switch SSW3.

Figure 2:
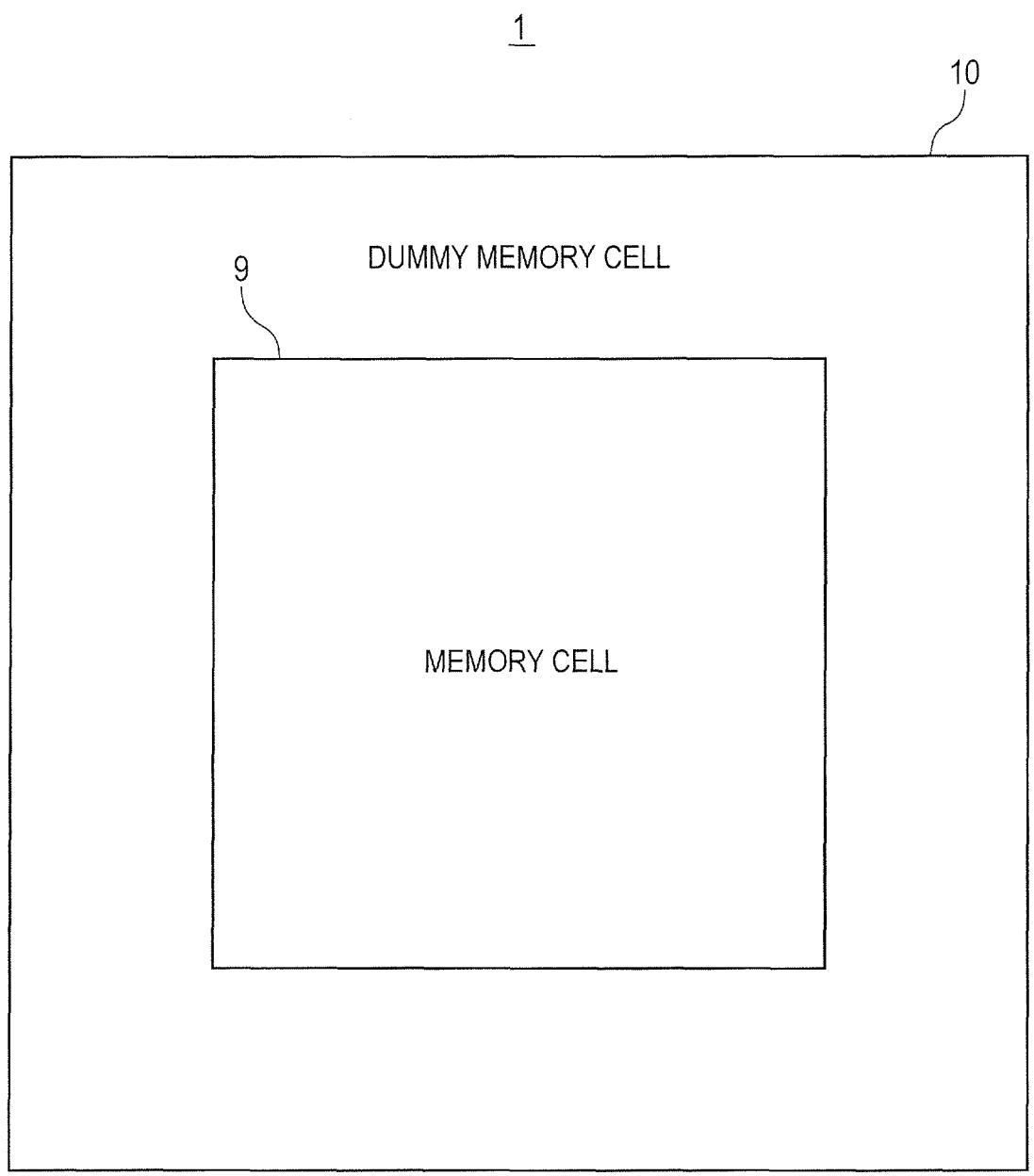
FIG. 2 is a diagram illustrating a configuration of a memory cell array according to the first embodiment.

A configuration of the memory cell array 9 included in the semiconductor memory device 1 according to the first embodiment will now be described with reference to FIG. 2. As illustrated in FIG. 2, the memory cell array 9 includes a region where a plurality of memory cells are disposed and a region where a plurality of dummy memory cells are disposed in the outer periphery of the former region.

As mentioned earlier, the memory cells include the memory cells MC0-MC7, and the dummy memory cells include the dummy memory cells MCdmy0, MCdmy1.

Memory cell characteristics in the outer peripheral region of the memory cell array 9 may differ from those in the inner region of the memory cell array 9. The reason is that these regions differ, for example, in the height of gate polysilicon. As indicated, for example, in FIG. 3, the height of gate polysilicon of the memory cells in the memory cell array 9 tends to decrease with a decrease in the distance to the outermost periphery of the memory cell array 9. Therefore, the probability of the deterioration of memory cell characteristics and the occurrence of memory cell defects tends to increase with a decrease in the distance to the outermost periphery of the memory cell array 9. In the first embodiment, therefore, the dummy memory cells are inserted until the height of gate polysilicon is stabilized. The dummy memory cells that are disposed in the memory cell array 9 and included in a region where the height of gate polysilicon is steadily stabilized are then used as the dummy memory cells MCdmy0, MCdmy1.

Figure 3:
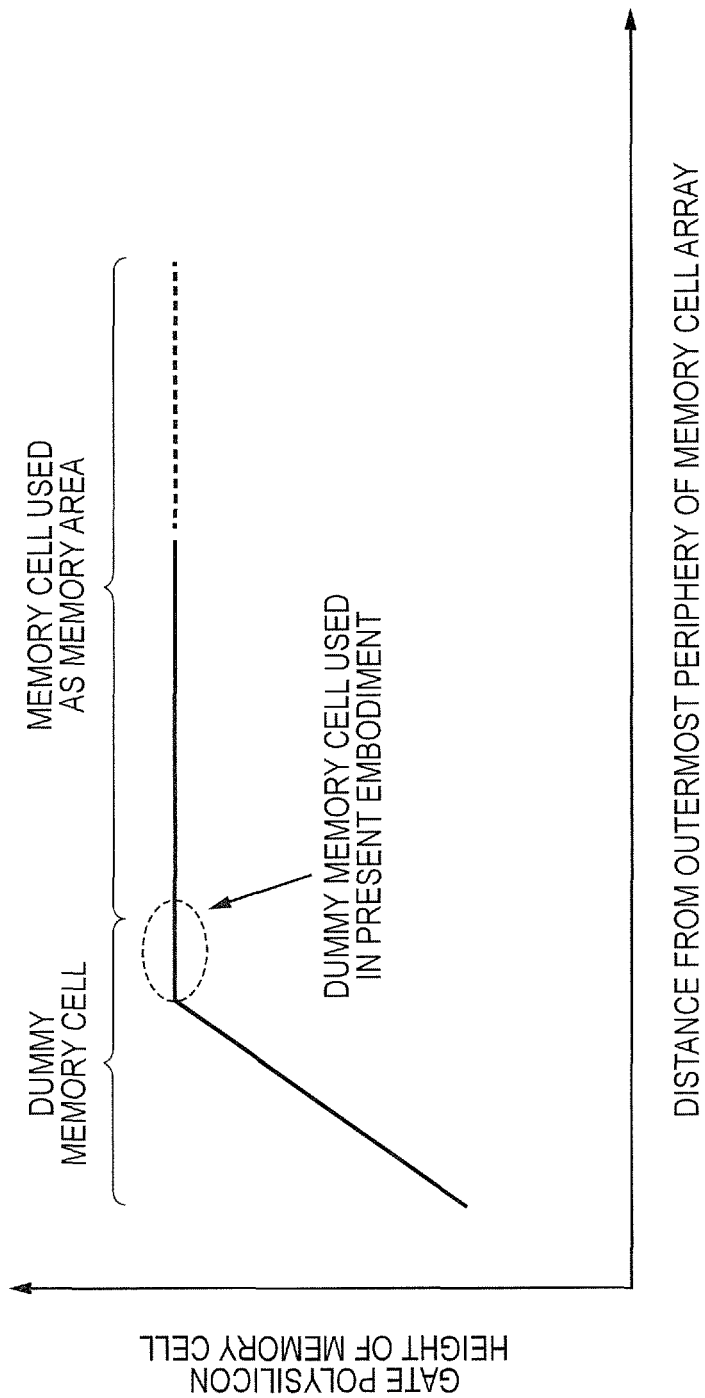
FIG. 3 is a diagram illustrating the relationship in the memory cell array according to the first embodiment between the distance from an outermost periphery and the height of gate polysilicon.

That is to say, within the memory cell array 9, the memory cells MC0-MC7 and the dummy memory cells MCdmy0, MCdmy1 are disposed in a region where the distance from the outermost periphery toward the center is not smaller than a predetermined value (e.g., a predefined region where the height of gate polysilicon is stabilized). Although the example of FIG. 3 depicts a configuration where the memory cells MC0-MC7 are disposed closer to the center than the dummy memory cells MCdmy0, MCdmy1, an alternative configuration may be employed. For example, within the memory cell array 9, the dummy memory cells MCdmy0, MCdmy1 may be disposed closer to the center than the memory cells MC0-MC7.

Operation of First Embodiment

A write operation of the semiconductor memory device 1 according to the first embodiment will now be described with reference to FIG. 4. The following describes an example in which the memory cell MC0 is to be written into as a write target memory cell and the memory cells MC2, MC3, MC6, MC7 are in an erased state, as indicated in FIG. 1.

In the subsequent description, a memory cell into which data is to be written may be referred to as a "selected memory cell", and a memory cell into which data is not to be written may be referred to as an "unselected memory cell". A sector including a selected memory cell may be referred to as a "selected sector", and a section including no selected memory cell may be referred to as an "unselected sector". A control gate line coupled to a selected memory cell may be referred to as a "selected control gate line", and a control gate line not coupled to a selected memory cell may be referred to as an "unselected control gate line". A source line coupled to a selected memory cell may be referred to as a "selected source line", and a source line not coupled to a selected memory cell may be referred to as an "unselected source line". A word line coupled to a selected memory cell may be referred to as a "selected word line", and a word line not coupled to a selected memory cell may be referred to as an "unselected word line". A bit line coupled to a selected memory cell may be referred to as a "selected bit line", and a bit line not coupled to a selected memory cell may be referred to as an "unselected bit line".

Before a write operation, a low-level voltage (0 V) is applied to all the word lines WL0-WL3, the control gate lines CG0, CG1, the source lines SL0, SL1, and the bit lines BL0, BL1 by the word line drivers WLDRV0-WLDRV3, the control gate line drivers CGDRV0, CGDRV1, the source line drivers SLDRV0, SLDRV1, and the write circuit WC.

Figure 5:
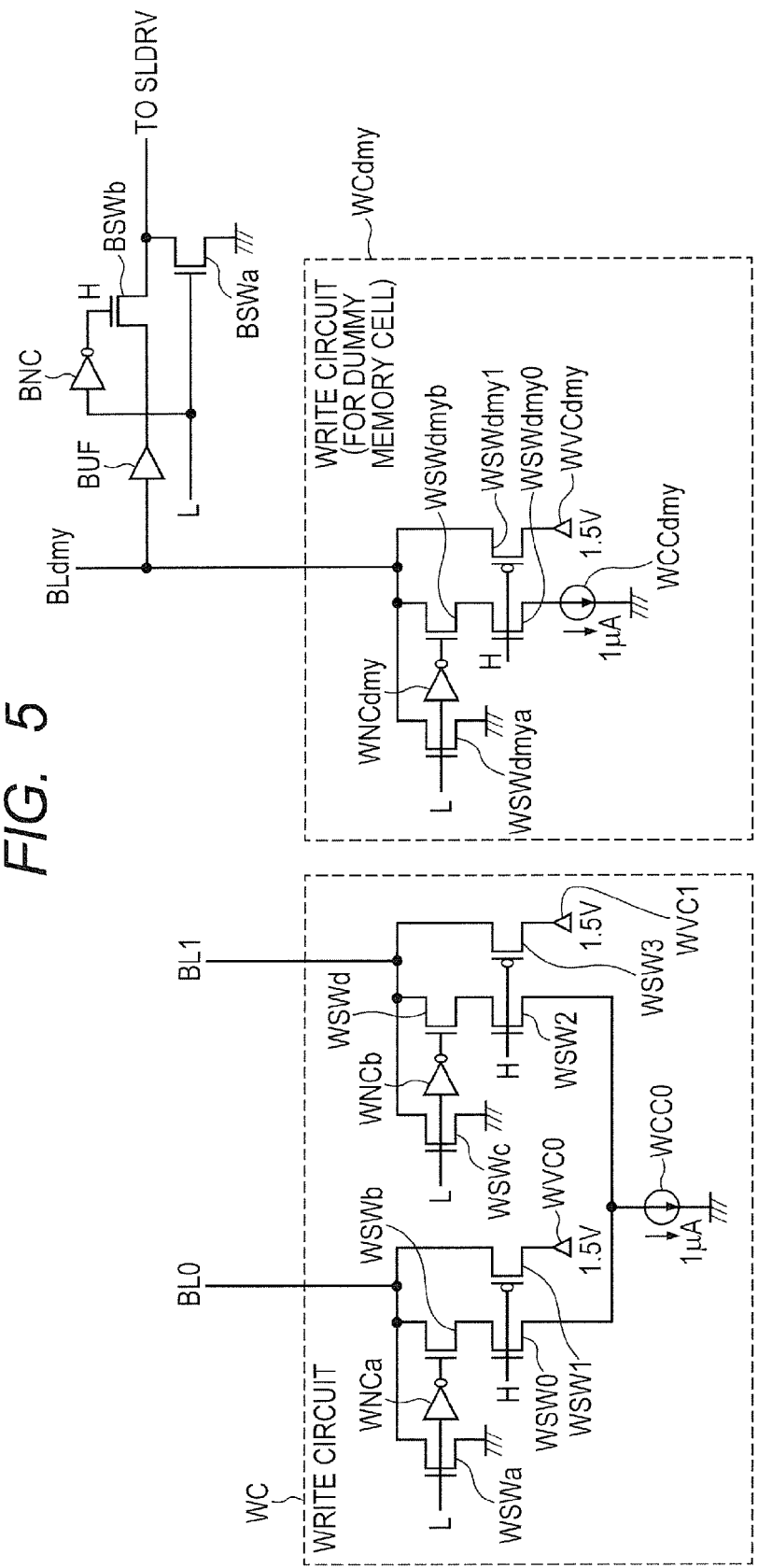
FIG. 5 is a diagram illustrating detailed configurations of write circuits and a peripheral circuit for a voltage buffer circuit in accordance with the first embodiment.

As regards the source lines SL0, SL1 and the bit lines BL0, BL1, more specifically, as indicated in FIG. 5, the write circuit WC further includes switches WSWa-WSWd and inverters WNCa, WNCb, and the semiconductor memory device 1 further includes switches BSWa, BSWb and an inverter BNC, which are disposed to follow the voltage buffer circuit BUF.

The bit line BL0 is coupled to the ground through the switch WSWa, and coupled to the switch WSW0 through the switch WSWb. That is to say, the bit line BL0 is coupled to the current source circuit WCC0 through the switch WSWb and the switch WSW0.

The switch WSWa and the switch WSWb turn on exclusively. That is to say, when applying a low-level voltage to the bit line BL0, the write circuit WC turns on the switch WSWa and turns off the switch WSWb. This electrically couples the ground to the bit line BL0 and electrically uncouples the switch WSW0 from the bit line BL0. Thus, a low-level voltage (0 V) is applied to the bit line BL0. Meanwhile, when applying a constant current or a high-level voltage to the bit line BL0, the write circuit WC turns off the switch WSWa and turns on the switch WSWb. This electrically uncouples the ground from the bit line BL0 and electrically couples both the switches WSW0, WSW1 to the bit line BL0. Thus, a constant current (1 μA) or a high-level voltage (1.5 V) is applied to the bit line BL0.

For example, the switch WSWa and the switch WSWb are n-type MOS transistors. The inverter WNCb inputs a gate voltage that is applied to the switch WSWa. The inverter WNCb inverts the logic level of the inputted gate voltage and applies the inverted gate voltage to the switch WSWb. As a result, the switch WSWa and the switch WSWb can be turned on exclusively as mentioned above.

Consequently, the write circuit WC applies a low-level voltage (0 V) to the bit line BL0 by turning on the switch WSWa, turning off the switch WSWb, turning on the switch WSW0, and turning off the switch WSW1. The write circuit WC applies a constant current (1 μA) to the bit line BL0 by turning off the switch WSWa, turning on the switch WSWb, turning on the switch WSW0, and turning off the switch WSW1. The write circuit WC applies a high-level voltage (1.5 V) to the bit line BL0 by turning off the switch WSWa, turning on the switch WSWb, turning off the switch WSW0, and turning on the switch WSW1.

The relationship between the state of the bit line BL1 and the states of the switches WSWc, WSWd, WSW2, WSW3 is the same as the above-described relationship between the state of the bit line BL0 and the states of the switches WSWa, WSWb, WSW0, WSW1 and, therefore, will not be described.

The source line drivers SLDRV0, SLDRV1 are coupled to the ground through the switch BSWa, and coupled to the voltage buffer circuit BUF through the switch BSWb.

The switch BSWa and the switch BSWb turn on exclusively. When applying a first voltage, as a low-level voltage, to the source line drivers SLDRV0, SLDRV1, the semiconductor memory device 1 turns on the switch BSWa and turns off the switch BSWb. This electrically couples the ground to the source line drivers SLDRV0, SLDRV1 and electrically uncouples the voltage buffer circuit BUF from the source line drivers SLDRV0, SLDRV1. Thus, the first voltage (0 V) is applied to the source line drivers SLDRV0, SLDRV1. Meanwhile, when applying a second voltage, as a low-level voltage, to the source line drivers SLDRV0, SLDRV1, the semiconductor memory device 1 turns off the switch BSWa and turns on the switch BSWb. This electrically uncouples the ground from the source line drivers SLDRV0, SLDRV1 and electrically couples the voltage buffer circuit BUF to the source line drivers SLDRV0, SLDRV1. Thus, the second voltage (the voltage of the dummy bit line BLdmy that is delivered through the voltage buffer circuit BUF) is applied to the source line drivers SLDRV0, SLDRV1.

For example, the switch BSWa and the switch BSWb are n-type MOS transistors. The inverter BNC inputs a gate voltage that is applied to the switch BSWa. The inverter BNC inverts the logic level of the inputted gate voltage and applies the inverted gate voltage to the switch BSWb. As a result, the switch BSWa and the switch BSWb can be turned on exclusively as mentioned above.

Further, a low-level voltage (0 V) is applied to the dummy word line WLdmy0, the dummy control gate line CGdmy, the dummy source line SLdmy, and the dummy bit line BLdmy by the word line driver WLDRVdmy0, the control gate line driver CGDRVdmy, the source line driver SLDRVdmy, and the write circuit WCdmy.

As regards the dummy bit line BLdmy, more specifically, as indicated in FIG. 5, the write circuit WCdmy further includes switches WSWdmya, WSWdmyb and an inverter WNCdmy. The dummy bit line BLdmy is coupled to the ground through the switch WSWdmya, and coupled to the switch WSWdmy0 through the switch WSWdmyb. That is to say, the dummy bit line BLdmy is coupled to the current source circuit WCC0 through the switch WSWdmyb and the switch WSWdmy0.

The relationship between the state of the dummy bit line BLdmy and the states of the switches WSWdmya, WSWdmyb, WSWdmy0, WSWdmy1 is the same as the above-described relationship between the state of the bit line BL0 and the states of the switches WSWa, WSWb, WSW0, WSW1 and, therefore, will not be described.

Figure 4:
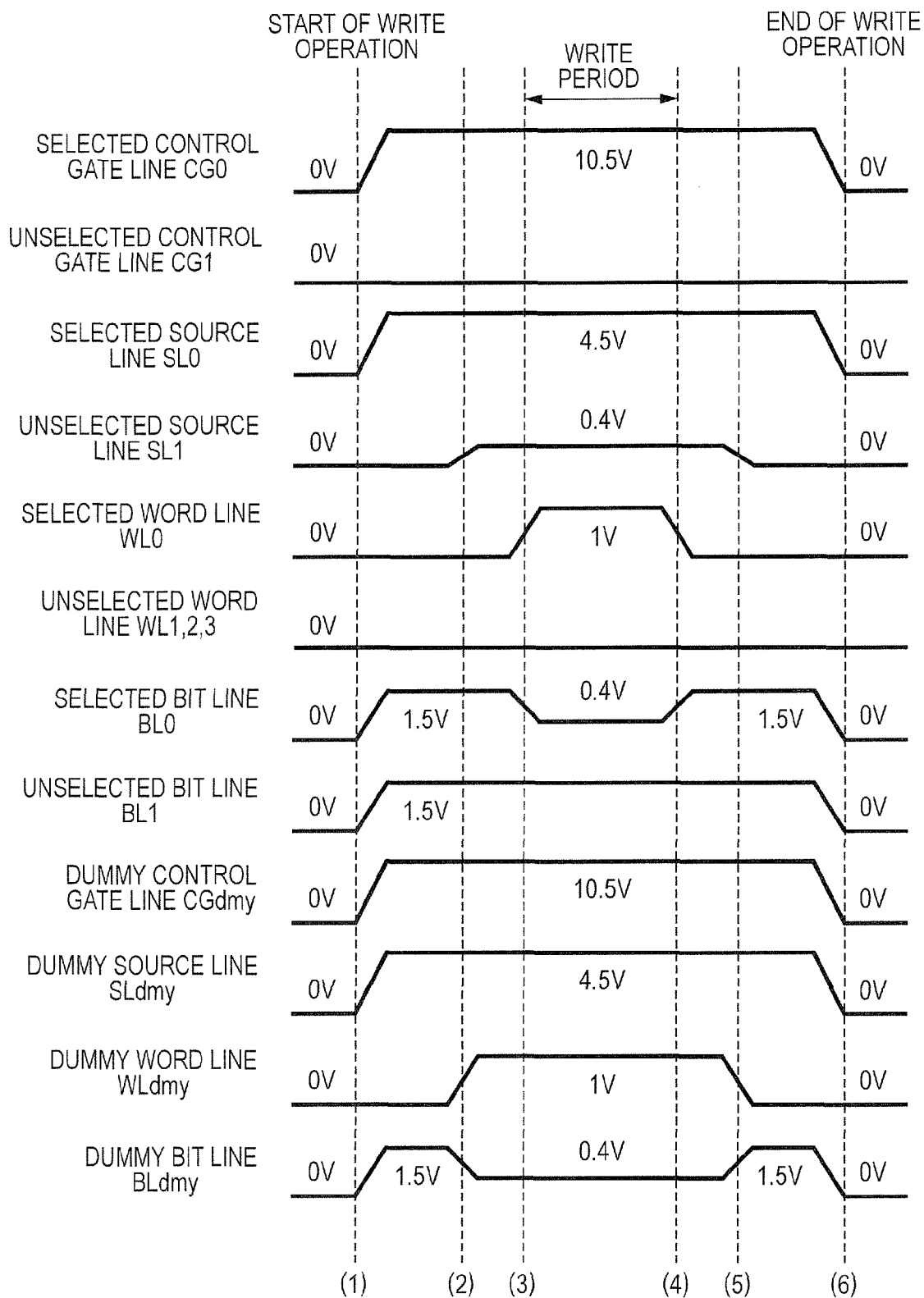
FIG. 4 is a timing diagram illustrating a write operation of the semiconductor memory device according to the first embodiment.

First Timing ((1) in FIG. 4)

At the beginning of a write operation, the control gate driver CGDRV0 finishes applying a low-level voltage (0 V) to a selected control gate line CG0, and starts applying a high-level voltage (10.5 V) to the selected control gate line CG0. The source line driver SLDRV0 finishes applying a low-level voltage (0 V) to a selected source line SL0, and starts applying a high-level voltage (4.5 V) to the selected source line SL0. The write circuit WC finishes applying a low-level voltage (0 V) to all the bit lines BL0, BL1, and starts applying, to all the bit lines BL0, BL1, a high-level voltage (1.5 V; a voltage higher than the high-level voltage of a later-described word line) that does not erroneously write into the memory cells MC0-MC7.

Further, the control gate line driver CGDRVdmy finishes applying a low-level voltage (0 V) to the dummy control gate line CGdmy, and starts applying a high-level voltage (10.5 V) to the dummy control gate line CGdmy. The source line driver SLDRVdmy finishes applying a low-level voltage (0 V) to the dummy source line SLdmy, and starts applying a high-level voltage (4.5 V) to the dummy source line SLdmy. The write circuit WCdmy finishes applying a low-level voltage (0 V) to the dummy bit line BLdmy, and starts applying, to the dummy bit line BLdmy, a high-level voltage (1.5V; a voltage higher than the high-level voltage of a later-described dummy word line) that does not erroneously write into the dummy memory cell MCdmy0.

Second Timing ((2) in FIG. 4)

The word line driver WLDRVdmy0 finishes applying a low-level voltage (0 V) to the dummy word line WLdmy0, and starts applying a high-level voltage (1.0 V) to the dummy word line WLdmy0. The write circuit WCdmy finishes applying a high-level voltage (1.5 V) to the dummy bit line BLdmy, and starts applying a constant current (1 μA) to the dummy bit line BLdmy. Thus, a current flows in the dummy memory cell MCdmy0 from the dummy source line SLdmy having a high voltage toward the dummy bit line BLdmy having a relatively low voltage. Hot electrons generated by such a current flow are then injected into the floating gate. As a result, data is written into the memory transistor MTdmy0 in the dummy memory cell MCdmy0. That is to say, in the above instance, the selection transistor STdmy0 in the dummy memory cell MCdmy0 and the second terminal of the memory transistor MTdmy0 function as a drain, and the third terminal functions as a source.

In the above instance, the dummy bit line BLdmy has a voltage (0.4 V) that is obtained by subtracting the threshold voltage (0.6 V; "Vgs" in FIG. 1) of the selection transistor STdmy0 in the dummy memory cell MCdmy0 from the voltage (1.0 V; "VWLdmy0" in FIG. 1) of the dummy word line WLdmy0. The semiconductor memory device 1 then turns off the switch BSWa and turns on the switch BSWb to finish applying a ground voltage (0 V) to the unselected source line SL1 and start applying the voltage (0.4 V) of the dummy bit line BLdmy to the unselected source line SL1 through the voltage buffer circuit BUF and the source line driver SLDRV1.

The threshold voltage of the selection transistors ST0-ST7, STdmy1 in the other memory cells MC0-MC7 and the dummy memory cell MCdmy1 is also the same as the threshold voltage of the selection transistor STdmy0 in the dummy memory cell MCdmy0. Here, the threshold voltage is a gate-source voltage (a value obtained by subtracting a source voltage from a gate voltage) that is necessary for delivering a constant current for writing data into each of the memory cells MC0-MC7 and the dummy memory cells MCdmy0, MCdmy1.

That is to say, as indicated in FIG. 1, the constant current delivered from the current source circuit WCC0 toward the ground decreases the voltage of the source (dummy bit line BLdmy) of the selection transistor STdmy0. The voltage of the source (dummy bit line BLdmy) decreases until a value obtained by subtracting the voltage of the source (dummy bit line BLdmy) from the voltage of the gate (dummy word line WLdmy0) of the selection transistor STdmy0 is equal to the threshold voltage of the selection transistor STdmy0. A current for a write then flows in the dummy memory cell MCdmy0.

Third Timing ((3) in FIG. 4)

The word line driver WLDRV0 finishes applying a low-level voltage (0 V) to the selected word line WL0 and starts applying a high-level voltage (1.0 V) to the selected word line WL0. The write circuit WC finishes applying a high-level voltage (1.5 V) to the selected bit line BL0 and starts applying a constant current (1 µA) to the selected bit line BL0. Thus, a current flows in the memory cell MC0 from the source line SL0 having a high voltage toward the bit line BL0 having a relatively low voltage. Hot electrons generated by such a current flow are then injected into the floating gate. As a result, data is written into the memory cell MC0. That is to say, in the above instance, the selection transistor ST0 in the memory cell MC0 and the second terminal of the memory transistor MT0 function as a drain, and the third terminal functions as a source.

In the above instance, as is the case with the above-mentioned dummy memory cell MCdmy0, the selected bit line BL0 has a voltage (0.4 V) that is obtained by subtracting the threshold voltage (0.6 V; "Vgs" in FIG. 1) of the selection transistor ST0 in the selected memory cell MC0 from the voltage (1.0 V; "VWL0" in FIG. 1) of the selected word line WL0.

Here, as mentioned above, the voltage of the unselected source line SL1 is equal (0.4 V) to the voltage of the dummy bit line BLdmy. Therefore, the voltage of the selected bit line BL0 coupled to the unselected memory cells MC2, MC3 is the same (0.4 V) as the voltage of the unselected source line SL1 coupled to the unselected memory cells MC2, MC3. Consequently, a subthreshold leak current in the unselected memory cells MC2, MC3 can be eliminated.

Further, the voltage difference between the voltage (1.5 V) of the unselected bit line BL1 coupled to the unselected memory cells MC6, MC7 and the voltage (0.4 V) of the unselected source line SL1 coupled to the unselected memory cells MC6, MC7 is reduced. Additionally, the threshold voltage of the unselected memory cells MC6, MC7 is increased by a substrate bias effect that is produced when a voltage is applied to the source line SL1. Consequently, the subthreshold leak current in the unselected memory cells MC6, MC7 can be reduced.

Fourth Timing ((4) in FIG. 4)

When the time sufficient for writing data into the selected memory cell MC0 ("WRITE PERIOD" in FIG. 4) has elapsed from the third timing, the word line driver WLDRV0 finishes applying a high-level voltage (1 V) to the selected word line WL0 and starts applying a low-level voltage (0 V) to the selected word line WL0. The write circuit WC finishes applying a constant current (1 µA) to the selected bit line BL0 and starts applying, to the selected bit line BL0, a voltage (1.5V) having a voltage level that does not erroneously write into the memory cell MC0.

Fifth Timing ((5) in FIG. 4)

The word line driver WLDRVdmy0 finishes applying a high-level voltage (1 V) to the dummy word line WLdmy0 and starts applying a low-level voltage (0 V) to the dummy word line WLdmy0. The write circuit WCdmy finishes applying a constant current (1 µA) to the dummy bit line BLdmy and starts applying, to the dummy bit line BLdmy, a voltage (1.5V) having a voltage level that does not erroneously write into the dummy memory cell MCdmy0. The semiconductor memory device 1 turns on the switch BSWa and turns off the switch BSWb to finish applying the voltage (0.4 V) of the dummy bit line BLdmy to the unselected source line SL1 and start applying a low-level voltage (0 V) to the unselected source line SL1 through the source line driver SLDRV1.

Sixth Timing ((6) in FIG. 4)

The control gate line driver CGDRV0 finishes applying a high-level voltage (10.5 V) to the selected control gate line CG0 and starts applying a low-level voltage (0 V) to the selected control gate line CG0. The source line driver SLDRV0 finishes applying a high-level voltage (4.5 V) to the selected source line SL0 and starts applying a low-level voltage (0 V) to the selected source line SL0. The write circuit WC finishes applying a high-level voltage (1.5 V) to all the bit lines BL0, BL1 and starts applying a low-level voltage (0 V) to all the bit lines BL0, BL1.

Further, the control gate line driver CGDRVdmy finishes applying a high-level voltage (10.5 V) to the dummy control gate line CGdmy and starts applying a low-level voltage (0 V) to the dummy control gate line CGdmy. The source line driver SLDRVdmy finishes applying a high-level voltage (4.5 V) to the dummy source line SLdmy and starts applying a low-level voltage (0 V) to the dummy source line SLdmy. The write circuit WCdmy finishes applying a high-level voltage (1.5 V) to the dummy bit line BLdmy and starts applying a low-level voltage (0 V) to the dummy bit line BLdmy.

Modification of First Embodiment

The above description relates to a case where the application of a high-level voltage (1 V) to the dummy word line WLdmy0 starts at the second timing after the voltage levels, for example, of the bit lines BL0, BL1 are changed at the first timing. However, the first embodiment is not limited to such an operation. As for the dummy memory cell MCdmy0, it is not necessary to take precautions against an erroneous write. Therefore, as described below with reference to FIG. 6, a high-level voltage (1 V) may alternatively be applied to the dummy word line WLdmy0 at the first to sixth timings without applying a voltage (1.5 V) that does not erroneously write into the dummy memory cell MCdmy0. Such an alternative operation is described below by indicating the difference from the operation described with reference to FIG. 4 for brevity of explanation.

Figure 6:
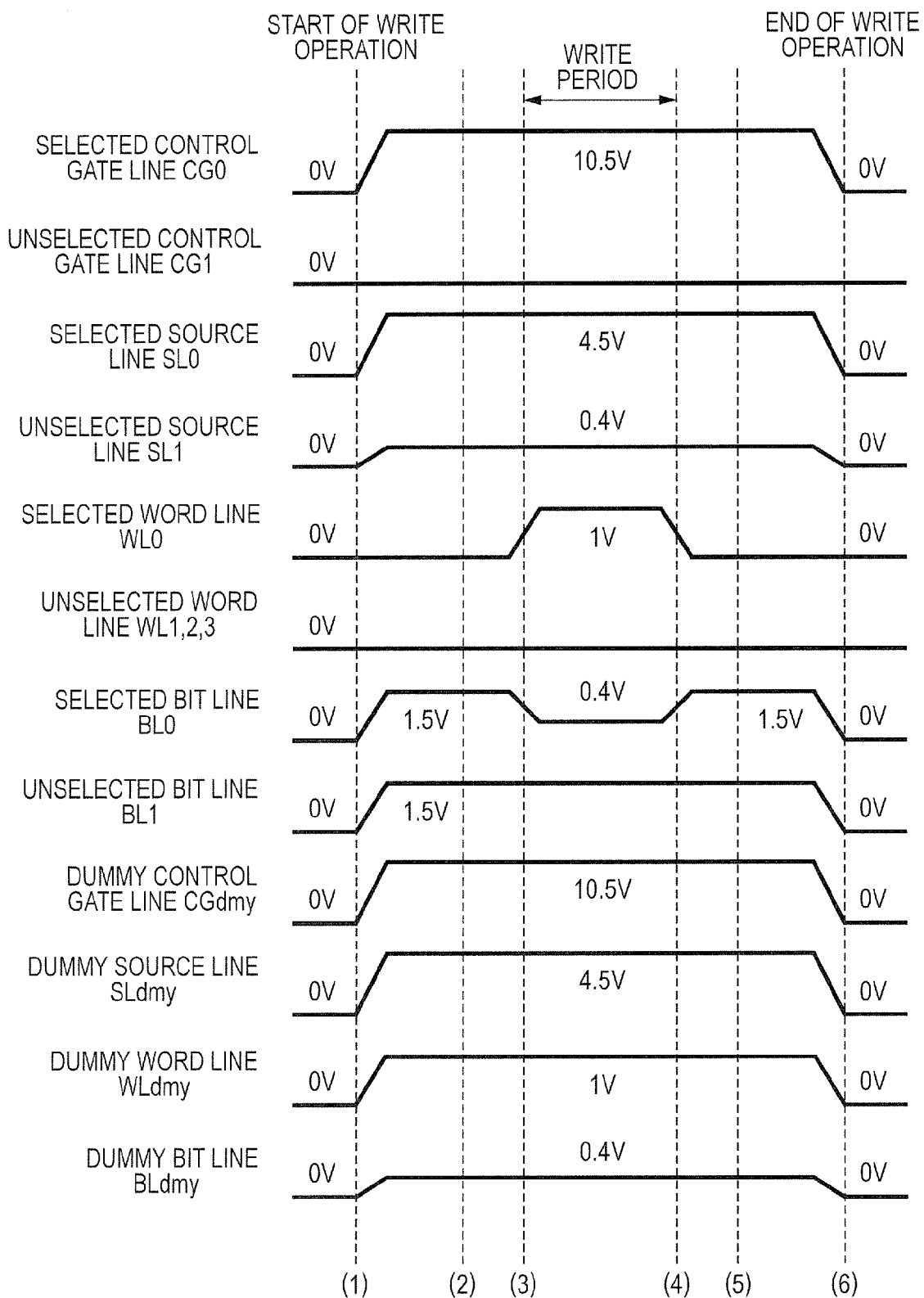
FIG. 6 is a timing diagram illustrating a write operation of the semiconductor memory device according to a modification of the first embodiment.

First Timing ((1) in FIG. 6)

The word line driver WLDRVdmy0 finishes applying a low-level voltage (0 V) to the dummy word line WLdmy0 and starts applying a high-level voltage (1.0 V) to the dummy word line WLdmy0. The write circuit WCdmy finishes applying a low-level voltage (0 V) to the dummy bit line BLdmy and starts applying a constant current (1 µA) to the dummy bit line BLdmy. Further, the semiconductor memory device 1 turns off the switch BSWa and turns on the switch BSWb. As a result, as is the case with the earlier-described operation, the dummy bit line BLdmy and the unselected source line SL1 have a voltage (0.4 V) that is obtained by subtracting the threshold voltage (0.6 V) of the selection transistor STdmy0 in the dummy memory cell MCdmy0 from the voltage (1.0 V) of the dummy word line WLdmy0.

Sixth Timing ((6) in FIG. 6)

The word line driver WLDRVdmy0 finishes applying a high-level voltage (1.0 V) to the dummy word line WLdmy0 and starts applying a low-level voltage (0 V) to the dummy word line WLdmy0. Further, the semiconductor memory device 1 turns on the switch BSWa and turns off the switch BSWb. The voltage of the unselected source line SL1 is then equal to the ground voltage (0 V). The write circuit WCdmy finishes applying a constant current (1 µA) to the dummy bit line BLdmy and starts applying a low-level voltage (0 V) to the dummy bit line BLdmy.

Consequently, no control signal needs to be added at the second timing ((2) in FIG. 6) and at the fifth timing ((5) in FIG. 6). More specifically, the semiconductor memory device 1 includes a control circuit (not shown) that exercises overall control over changes in the voltage or current to be applied to the signal lines WL0-WL3, WLdmy0, CG0, CG1, CGdmy, SL0, SL1, SLdmy, BL0, BL1, BLdmy. The control circuit outputs a control signal for giving an instruction for a voltage change or a current change to the drivers WLDRV1-WLDRV3, WLDRVdmy0, CGDRV0, CGDRV1, CGDRVdmy, SLDRV0, SLDRV1, SLDRVdmy and the write circuits WC, WCdmy. The drivers WLDRV1-WLDRV3, WLDRVdmy0, CGDRV0, CGDRV1, CGDRVdmy, SLDRV0, SLDRV1, SLDRVdmy and the write circuits WC, WCdmy apply, for example, the above-mentioned voltage level changes in compliance with the control signal from the control circuit.

Meanwhile, according to the operation described with reference to FIG. 6, the control circuit need not output the control signal for a voltage change or a current change at the second timing ((2) in FIG. 6) and at the fifth timing ((5) in FIG. 6). Therefore, the configuration of the control circuit can be simplified. Further, according to the present modification, the write circuit WCdmy does not need the switches WSWdmy0, WSWdmy1 and the supply voltage circuit WVCdmy.

Advantageous Effects of First Embodiment (1) As described above, when a predetermined voltage (1 V) for writing data into the memory cell MC0 is to be applied to the word line WL0, the first embodiment couples the dummy bit line BLdmy to the source line SL1 and applies the predetermined voltage (1 V) to the dummy word line WLdmy0 of the dummy memory cell MCdmy0.

Consequently, during a write operation, a voltage of 0.4 V, which is the same as the voltage of the selected bit line BL0 coupled to the selected memory cell MC0 into which data is to be written, is applied to the unselected source line SL1 coupled to the unselected memory cells MC2, MC3, which are coupled to the selected bit line BL0. Therefore, in the unselected memory cells MC2, MC3, the subthreshold leak current flowing from the source line SL1 toward the bit line BL0 and the subthreshold leak current flowing from the bit line BL0 toward the source line SL1 can be both eliminated.

When the leak current flows from the bit line BL0 toward the source line SL1, the leak current delivered by the unselected memory cells MC2, MC3 actually decreases the voltage of the selected bit line BL0 to a voltage lower than 0.4 V. This increases the difference between the source voltage (the voltage of the selected bit line BL0) and drain voltage (the voltage of the selected source line SL0) of the unselected memory cells MC2, MC3. Consequently, it is conceivable that an erroneous data write (write disturb) may occur in the unselected memory cells MC2, MC3. When the leak current flows from the source line SL1 toward the bit line BL0, the leak current delivered by the unselected memory cells MC2, MC3 actually increases the voltage of the selected bit line BL0 to a voltage higher than 0.4 V. This decreases the difference between the source voltage (the voltage of the selected bit line BL0) and drain voltage (the voltage of the selected source line SL0) of the selected memory cell MC0. Consequently, it is conceivable that the number of hot electrons may decrease to increase the write period of the selected memory cell MC0 or cause a write failure. Meanwhile, the first embodiment is able to eliminate the leak current as described earlier and thus avoid the above problem.

(2) During a write operation, a selected bit line has a voltage that is obtained by subtracting the gate-source voltage (Vgs) necessary for a selected transistor of a selected memory cell to deliver a write current from the high-level voltage of a selected word line.

During a write operation, the high-level voltage of a word line, which is generated by the supply voltage circuit, and a write constant current generated by the current source circuit may in some cases deviate from a specified value due, for instance, to temperature changes. Further, the threshold voltage of a selected transistor in a memory cell varies with temperature. Moreover, the high-level voltage of a word line, the write current, and the threshold voltage of a selected transistor in a memory cell may deviate from their specified values due to variations in manufacture (the finish, for example, of gate oxide film thickness).

Figure 7:
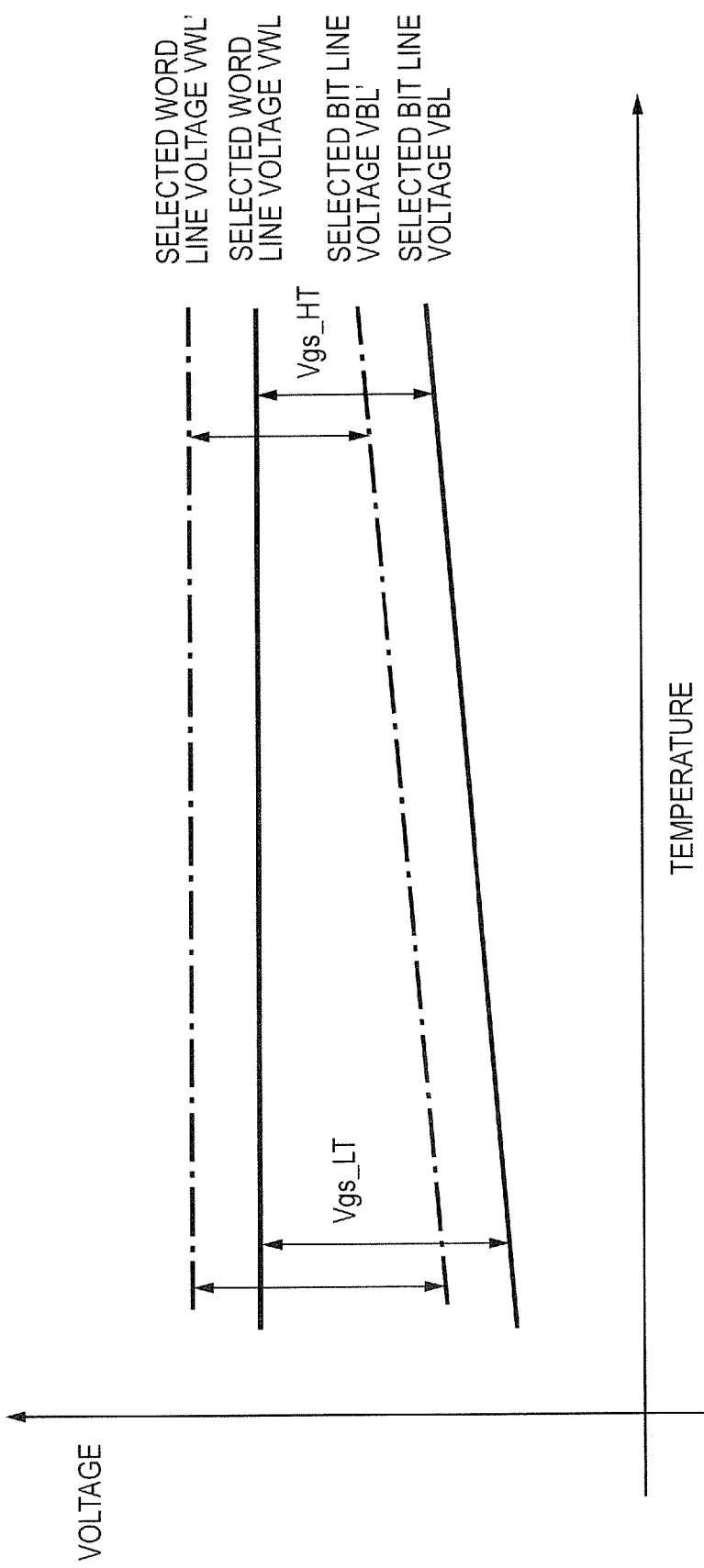
FIG. 7 is a diagram illustrating the temperature dependence of the voltage of a bit line in a memory that is performing a write.

FIG. 7 is a diagram illustrating the temperature dependence of the voltage of a selected bit line with respect to the high-level voltage of a selected word line during a write operation.

The threshold voltage of a selected transistor in a memory cell varies with temperature. Under normal conditions, the lower the temperature, the higher the threshold voltage. Therefore, the required threshold voltage Vgs increases with a decrease in temperature (low-temperature threshold voltage Vgs_LT>high-temperature threshold voltage Vgs_HT). Thus, if the voltage VWL of a selected word line is assumed to be constant irrespective of temperature, the voltage VBL of a selected bit line decreases with a decrease in temperature. Further, if a selected word line has a voltage VWL' that is higher than a specified value VWL, a selected bit line has a voltage VBL' that is higher than a specified value VBL.

Consequently, the voltage of a selected bit line varies with changes in temperature and other environmental factors and with element variations in manufacture. Meanwhile, the first embodiment applies the voltage of the bit line BLdmy, which is actually generated by the dummy memory cell MCdmy0 during a dummy write, to the unselected source line SL1 coupled to the unselected memory cells MC2, MC3. This ensures that the voltage of the selected bit line BL0 is the same as the voltage of the unselected source line SL1. Therefore, even when the voltage of the selected bit line BL0 changes due, for instance, to changes in temperature and variations in manufacture, the subthreshold leak current can be eliminated.

(3) Further, the first embodiment additionally includes the memory cells MC6, MC7. When writing data into the memory cell MC0, the write circuit WC applies, to the bit line BL1 coupled to the memory cells MC6, MC7, a predetermined voltage (1.5 V) that prevents an erroneous write into the memory cells MC6, MC7.

Moreover, during a write operation, the unselected memory cells MC6, MC7 coupled to the unselected bit line BL1 are also coupled to the unselected source line SL1 to which the voltage (0.4 V) of the dummy bit line BLdmy, which is generated by the dummy memory cell MCdmy0, is applied. This not only reduces the voltage difference between the voltage of the unselected bit line BL1 coupled to the unselected memory cells MC6, MC7 and the voltage of the unselected source line SL1 coupled to the unselected memory cells MC6, MC7, but also increases the threshold voltage of the unselected memory cells MC6, MC7 due to the substrate bias effect that is produced when a voltage is applied to the source line SL1. Consequently, the subthreshold leak current flowing in the unselected memory cells MC6, MC7 coupled to the unselected bit line BL1 can also be reduced.

Second Embodiment

Configuration of Second Embodiment

A second embodiment of the present invention will now be described with reference to the accompanying drawings. Elements identical with the corresponding elements in the first embodiment are, for example, designated by the same reference numerals as the corresponding elements, and will not be redundantly described. First of all, a configuration of a semiconductor memory device 2 according to the second embodiment will be described with reference to FIG. 8.

Figure 8:
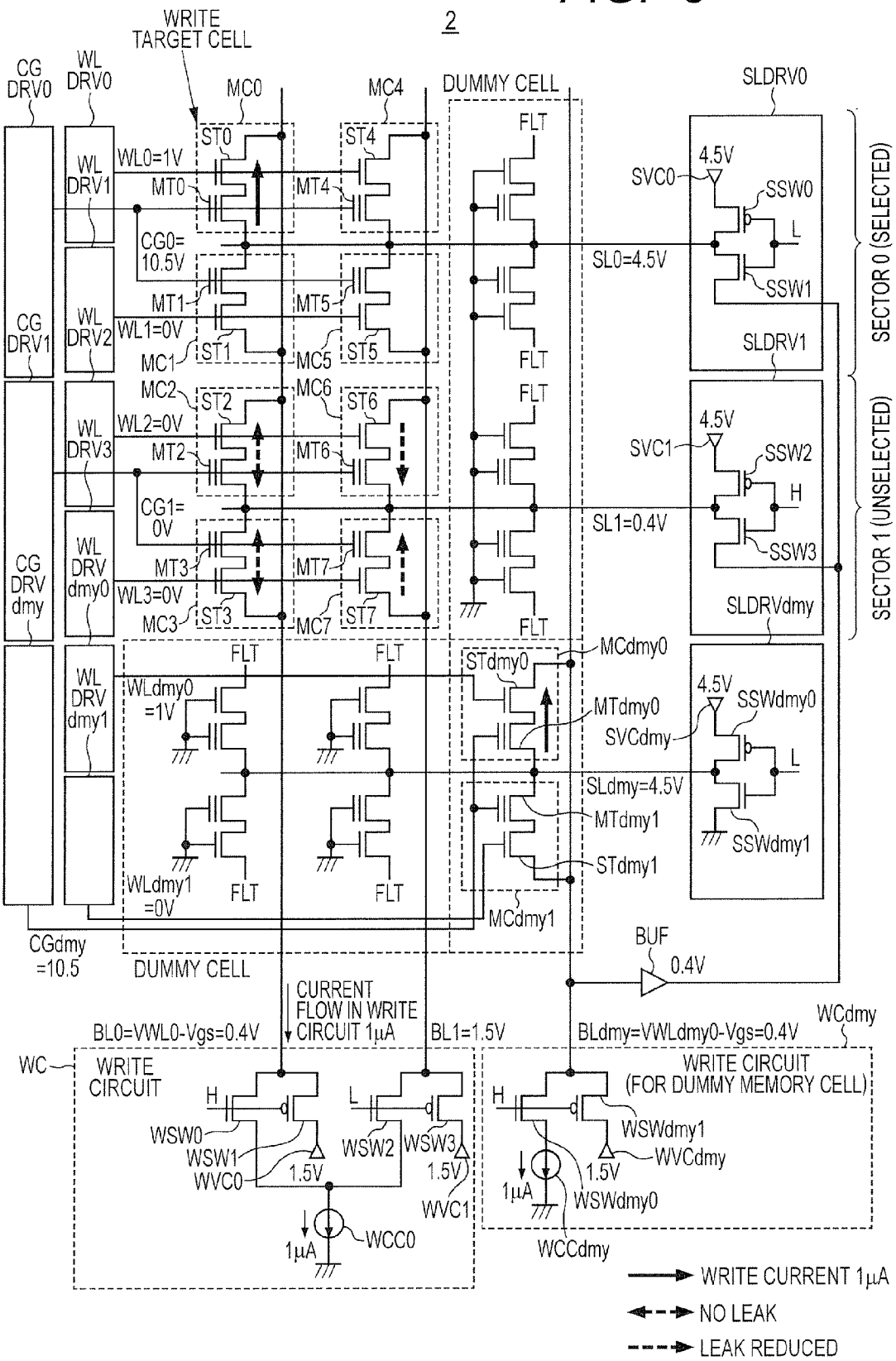
FIG. 8 is a diagram illustrating a configuration of the semiconductor memory device according to a second embodiment of the present invention.

As illustrated in FIG. 8, the semiconductor memory device 2 according to the second embodiment is different from the semiconductor memory device 1 according to the first embodiment illustrated in FIG. 1 in that the former additionally includes a word line driver WLDRVdmy1. Further, in the second embodiment, the first terminal of the selection transistor STdmy1 in the dummy memory cell MCdmy1 is coupled to a dummy word line WLdmy1 and not to the ground.

In the second embodiment, when writing data into one of the memory cells MC0, MC2, MC4, MC6 (the memory cells in the odd-numbered rows of the memory cell array 9 and not all the memory cells MC0-MC7 in the memory cell array 9), which are coupled to the even-numbered word lines WL0, WL2, the word line driver WLDRVdmy0 applies a high-level voltage (1 V) to the dummy word line WLdmy0. Meanwhile, when writing data into none of the memory cells MC0, MC2, MC4, MC6 coupled to the even-numbered word lines WL0, WL2, the word line driver WLDRVdmy0 applies a low-level voltage (0 V) to the dummy word line WLdmy0.

The word line driver WLDRVdmy1 has the same structure as the word line drivers WLDRV0-WLDRV3, WLDRVdmy0. The word line driver WLDRVdmy1 is coupled to the dummy word line WLdmy1. When writing data into one of the memory cells MC1, MC3, MC5, MC7 (the memory cells in the even-numbered rows of the memory cell array 9 and not all the memory cells MC0-MC7 in the memory cell array 9), which are coupled to the odd-numbered word lines WL1, WL3, the word line driver WLDRVdmy1 applies a high-level voltage (1 V) to the dummy word line WLdmy1. Meanwhile, when writing data into none of the memory cells MC1, MC3, MC5, MC7 coupled to the odd-numbered word lines WL1, WL3, the word line driver WLDRVdmy1 applies a low-level voltage (0 V) to the dummy word line WLdmy1.

Operation of Second Embodiment

In short, when writing into the memory cells MC0, MC2, MC4, MC6 (the memory cells in the odd-numbered rows of the memory cell array 9) coupled to the even-numbered word lines WL0, WL2, the second embodiment applies a high-level voltage (1 V) to the even-numbered dummy word line WLdmy0. Thus, the voltage of the bit line BLdmy, which is generated when data is written into the even-numbered dummy memory cell MCdmy0 (the dummy memory cell in an odd-numbered row of the memory cell array 9), is applied to an unselected source line.

Meanwhile, when writing into the memory cells MC1, MC3, MC5, MC7 (the memory cells in the even-numbered rows of the memory cell array 9) coupled to the odd-numbered word lines WL1, WL3, the second embodiment applies a high-level voltage (1 V) to the odd-numbered dummy word line WLdmy1. Thus, the voltage of the bit line BLdmy, which is generated when data is written into the odd-numbered dummy memory cell (the dummy memory cell in an even-numbered row of the memory cell array 9), is applied to an unselected source line.

Modification of Second Embodiment

In the second embodiment, too, as is the case with the modification of the first embodiment, a high-level voltage (1 V) may be applied to the dummy word lines WLdmy0, WLdmy1 at the first to sixth timings without applying a voltage (1.5 V) that does not erroneously write into the dummy memory cells MCdmy0, MCdmy1.

Advantageous Effects of Second Embodiment

As described above, when a predetermined voltage (1 V) for writing data into the memory cell MC0 is to be applied to the word line WL0, the second embodiment couples the dummy bit line BLdmy to the source line SL1 and applies the predetermined voltage (1 V) to the dummy word line WLdmy0 of the dummy memory cell MCdmy0. Meanwhile, when a predetermined voltage (1 V) for writing data into the memory cell MC1 is to be applied to the word line WL1, the second embodiment couples the dummy bit line BLdmy to the source line SL1 and applies the predetermined voltage to the dummy word line WLdmy1 of the dummy memory cell MCdmy1.

In the memory cell array 9, the memory cell MC0 and the dummy memory cell MCdmy0 are disposed in an odd-numbered row, and the memory cell MC1 and the dummy memory cell MCdmy1 are disposed in an even-numbered row.

(1) Due, for instance, to misalignment in a photomask exposure process during semiconductor manufacture, the properties exhibited by the memory cells MC0, MC2, MC4, MC6 coupled to the even-numbered word lines WL0, WL2 may differ in some cases from the properties exhibited by the memory cells MC1, MC3, MC5, MC7 coupled to the odd-numbered word lines WL1, WL3. If, for example, misalignment occurs in a gate polysilicon etching process for a selection transistor, the L sizes of the selection transistors ST0, ST2, ST4, ST6 in the memory cells MC0, MC2, MC4, MC6 coupled to the even-numbered word lines WL0, WL2 may become thinner in some cases than a specified L size. In such an instance, the L sizes of the selection transistors ST1, ST3, ST5, ST7 in the memory cells MC1, MC3, MC5, MC5 coupled to the odd-numbered word lines WL1, WL3 become thicker than the specified L size.

In the above instance, a decrease occurs in the threshold voltage of the selection transistors ST0, ST2, ST4, ST6 in the memory cells MC0, MC2, MC4, MC6 coupled to the even-numbered word lines WL0, WL2, and an increase occurs in the threshold voltage of the selection transistors ST1, ST3, ST5, ST7 in the memory cells MC1, MC3, MC5, MC7 coupled to the odd-numbered word lines WL1, WL3.

Figure 9:
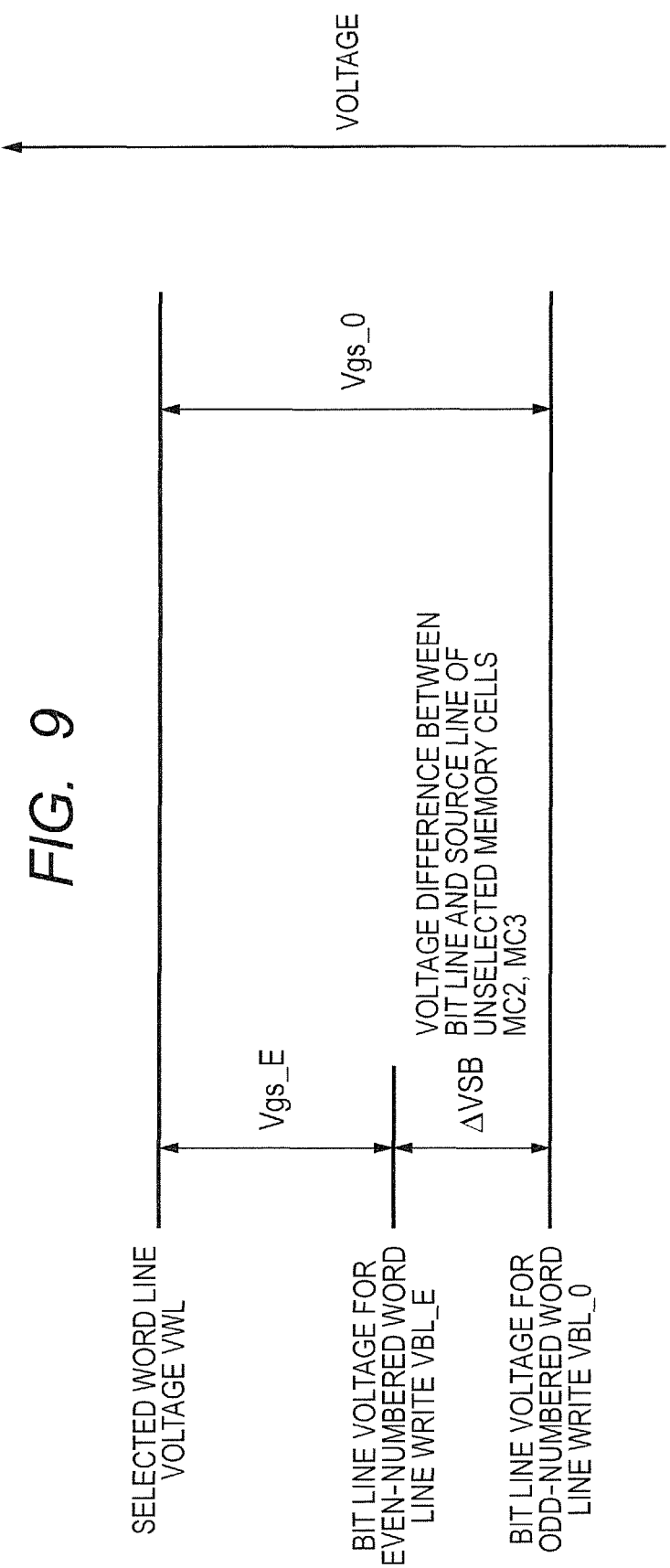
FIG. 9 is a diagram illustrating a misalignment-induced bit line voltage difference between a write into a memory cell coupled to an even-numbered word line and a write into a memory cell coupled to an odd-numbered word line.

FIG. 9 is a diagram illustrating the influence that is exerted when the threshold voltage of the selection transistors ST0, ST2, ST4, ST6 in the memory cells MC0, MC2, MC4, MC6 coupled to the even-numbered word lines WL0, WL2 is decreased and the threshold voltage of the selection transistors ST1, ST3, ST5, ST7 in the memory cells MC1, MC3, MC5, MC7 coupled to the odd-numbered word lines WL1, WL3 is increased.

When the threshold voltage Vgs_E of the selection transistors ST0, ST2, ST4, ST6 in the memory cells MC0, MC2, MC4, MC6 coupled to the even-numbered word lines WL0, WL2 is low and the threshold voltage Vgs_O of the selection transistors ST1, ST3, ST5, ST7 in the memory cells MC1, MC3, MC5, MC7 coupled to the odd-numbered word lines WL1, WL3 is high (Vgs_E<Vgs_O), the bit line voltage VBL_E of the even-numbered word lines WL0, WL2 during a write operation is higher than the bit line voltage VBL_O of the odd-numbered word lines WL1, WL3.

The first embodiment uses only the dummy memory cell MCdmy0 coupled to an even-numbered word line. When data is to be written into the memory cell MC0 on the even-numbered word line WL0, the leak current can be eliminated because the voltage VBL_E of the bit line BL0 coupled to the unselected memory cells MC, MC3 is the same as the voltage VBL_E of the unselected source SL1. Meanwhile, when data is to be written into the memory cell MC1 on the odd-numbered word line WL1, the unselected source line SL1 has the voltage VBL_O, which is lower than the voltage VBL_E of the bit line BL0 coupled to the unselected memory cells MC2, MC3. Therefore, the leak current is generated from the bit line BL0 toward the source line SL1.

Meanwhile, in the second embodiment, when data is to be written into the memory cells MC0, MC2, MC4, MC6 coupled to the even-numbered word lines WL0, WL2, the voltage of the dummy bit line BLdmy, which is generated when data is written into the dummy memory cell MCdmy0 coupled to the even-numbered word line WLdmy0, is applied to the source line SL1 coupled to the unselected memory cells MC2, MC3. Therefore, the bit line BL0 coupled to the unselected memory cells MC2, MC3 has the same voltage as the source line SL1. Thus, the subthreshold leak current can be eliminated.

Further, when data is to be written into the memory cells MC1, MC3, MC5, MC7 coupled to the odd-numbered word lines WL1, WL3, the voltage of the dummy bit line BLdmy, which is generated when data is written into the dummy memory cell MCdmy1 coupled to the odd-numbered word line WLdmy1, is applied to the source line SL1 coupled to the unselected memory cells MC2, MC3. Therefore, the bit line BL0 coupled to the unselected memory cells MC2, MC3 has the same voltage as the source line SL1. Thus, the subthreshold leak current can be eliminated.

Consequently, even when the memory cells MC0, MC2, MC4, MC6 coupled to the even-numbered word lines WL0, WL2 differ in memory cell selection transistor threshold voltage from the memory cells MC1, MC3, MC5, MC7 coupled to the odd-numbered word lines WL1, WL3 due to the influence of misalignment during manufacture, the subthreshold leak current can be eliminated.

Third Embodiment

Configuration of Third Embodiment

A third embodiment of the present invention will now be described with reference to the accompanying drawings. Elements identical with the corresponding elements in the first embodiment are, for example, designated by the same reference numerals as the corresponding elements, and will not be redundantly described. First of all, a configuration of a semiconductor memory device 3 according to the third embodiment will be described with reference to FIG. 10.

Figure 10:
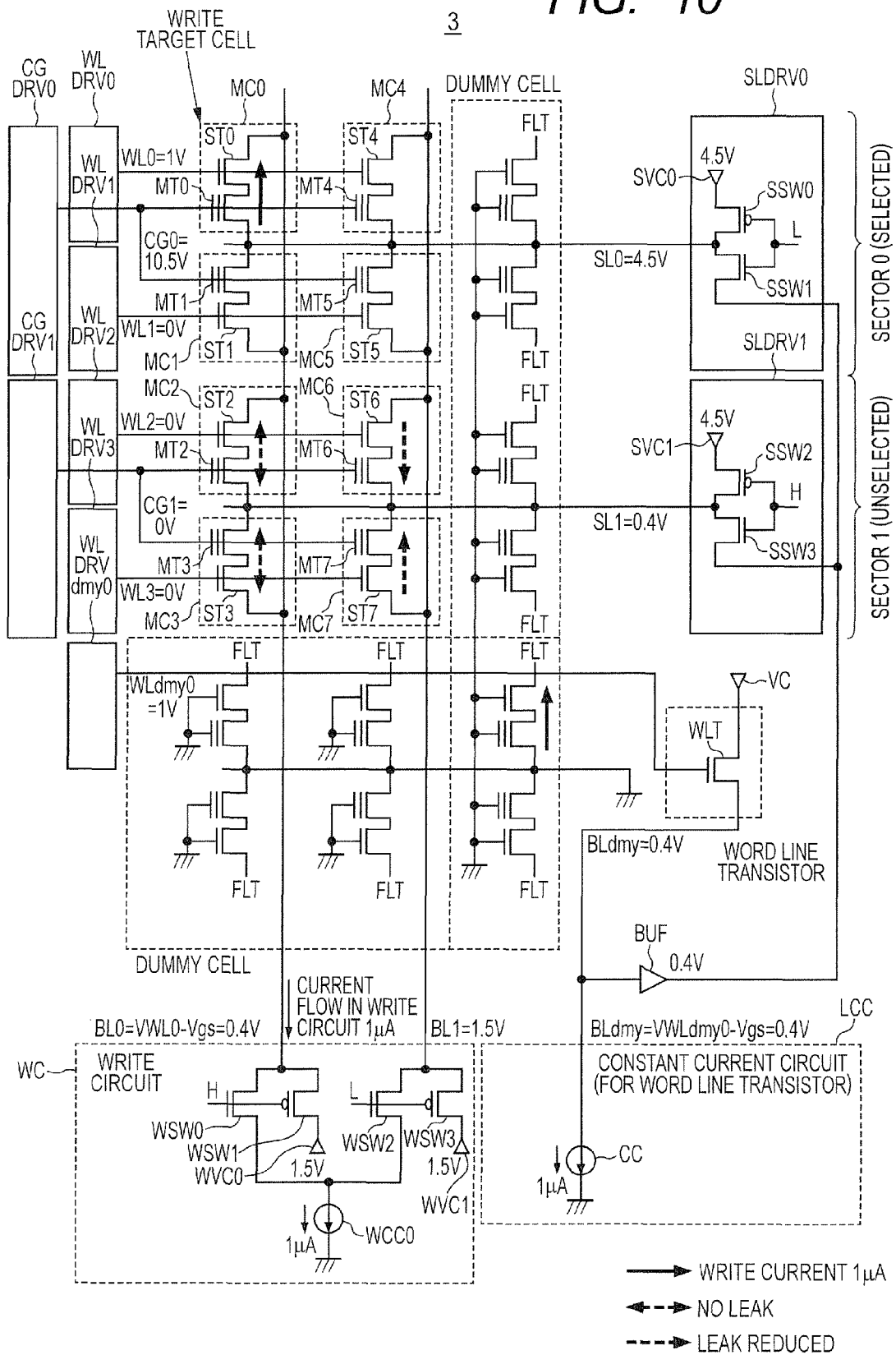
FIG. 10 is a diagram illustrating a configuration of the semiconductor memory device according to a third embodiment of the present invention.

As illustrated in FIG. 10, the semiconductor memory device 3 according to the third embodiment is different from the semiconductor memory device 1 according to the first embodiment illustrated in FIG. 1 in that the former does not include the control gate line driver CGDRVdmy, the source line driver SLDRVdmy, and the write circuit WCdmy, but includes a word line transistor WLT, a constant current circuit LCC, and a supply voltage circuit VC.

Further, the semiconductor memory device 3 according to the third embodiment does not include the dummy control gate line CGdmy and the dummy source line SLdmy. The first and second terminals of each dummy memory cell are coupled to the ground, and the third terminal is placed in a floating state ("FLT" in FIG. 10). Moreover, the dummy word line WLdmy0 is coupled to the first terminal of the word line transistor WLT and not to the first terminal of the selection transistor STdmy0 in the dummy memory cell MCdmy0.

The word line transistor WLT has the same structure as the selection transistors ST0-ST7 in the memory cells MC0-MC7. The word line transistor WLT is equal to the selection transistors ST0-ST7 in the memory cells MC0-MC7, for example, in gate oxide film thickness and ion injection conditions so that these transistors have the same threshold voltage.

The second terminal of the word line transistor WLT is coupled to the supply voltage circuit VC. The third terminal of the word line transistor WLT is coupled to the dummy bit line BLdmy. Therefore, the voltage buffer circuit BUF in the third embodiment operates so that the voltage applied from the word line transistor WLT to the dummy bit line BLdmy is applied to each of the source line drivers SLDVR0, SLDRV1. The supply voltage circuit VC generates a predetermined voltage and applies it to the word line transistor WLT. The predetermined voltage may have any value (e.g., 1 V or higher) in consideration of the drain-source voltage (Vds) necessary for delivering a constant current (1 µA) at the BLdmy voltage (0.4 V) during a write operation.

The constant current circuit LCC is coupled to the dummy bit line BLdmy. The constant current circuit LCC applies, to the dummy bit line BLdmy, the same constant current (1 µA)

as a constant current that is applied to a selected bit line by the write circuit WC during a write operation. More specifically, the constant current circuit LCC includes a current source circuit CC. The dummy bit line BLdmy is coupled to the current source circuit CC. A constant current (1 µA) generated by the current source circuit CC is applied to the dummy bit line BLdmy.

As described above, when data is to be written into one of the memory cells MC0-MC7 in the third embodiment, the same voltage (1 V) as the voltage applied to the selection transistors ST0-ST7 in the memory cells MC0-MC7 is applied to the word line transistor WLT. The word line transistor WLT has the same threshold voltage (0.6 V) as the selection transistors ST0-ST7 in the memory cells MC0-MC7.

Consequently, the dummy bit line BLdmy has a voltage of 0.4 V, which is obtained by subtracting the threshold voltage (0.6 V) from the voltage (1.0 V) of the dummy word line WLdmy0. That is to say, in the third embodiment, too, a write operation is performed so that the same voltage as the voltage of a selected bit line is applied to an unselected source line. Therefore, the leak current can be eliminated. If the intended purpose is to generate the same voltage (0.4 V) as the voltage (0.4 V) of a selected bit line as described above, no memory transistor is required.

Operation of Third Embodiment

A write operation of the semiconductor memory device 3 according to the third embodiment will now be described with reference to FIG. 11. The following describes an example in which the memory cell MC0 is to be written into as a write target memory cell and the memory cells MC2, MC3, MC6, MC7 are in the erased state, as indicated in FIG. 10.

Before a write operation, the word lines WL0-WL3, the control gate lines CG0, CG1, the source lines SL0, SL1, the dummy word line WLdmy0 ("word line transistor word line" in FIG. 11), and the dummy bit line BLdmy ("word line transistor bit line" in FIG. 11) are in the same states as in the first embodiment.

Figure 12:
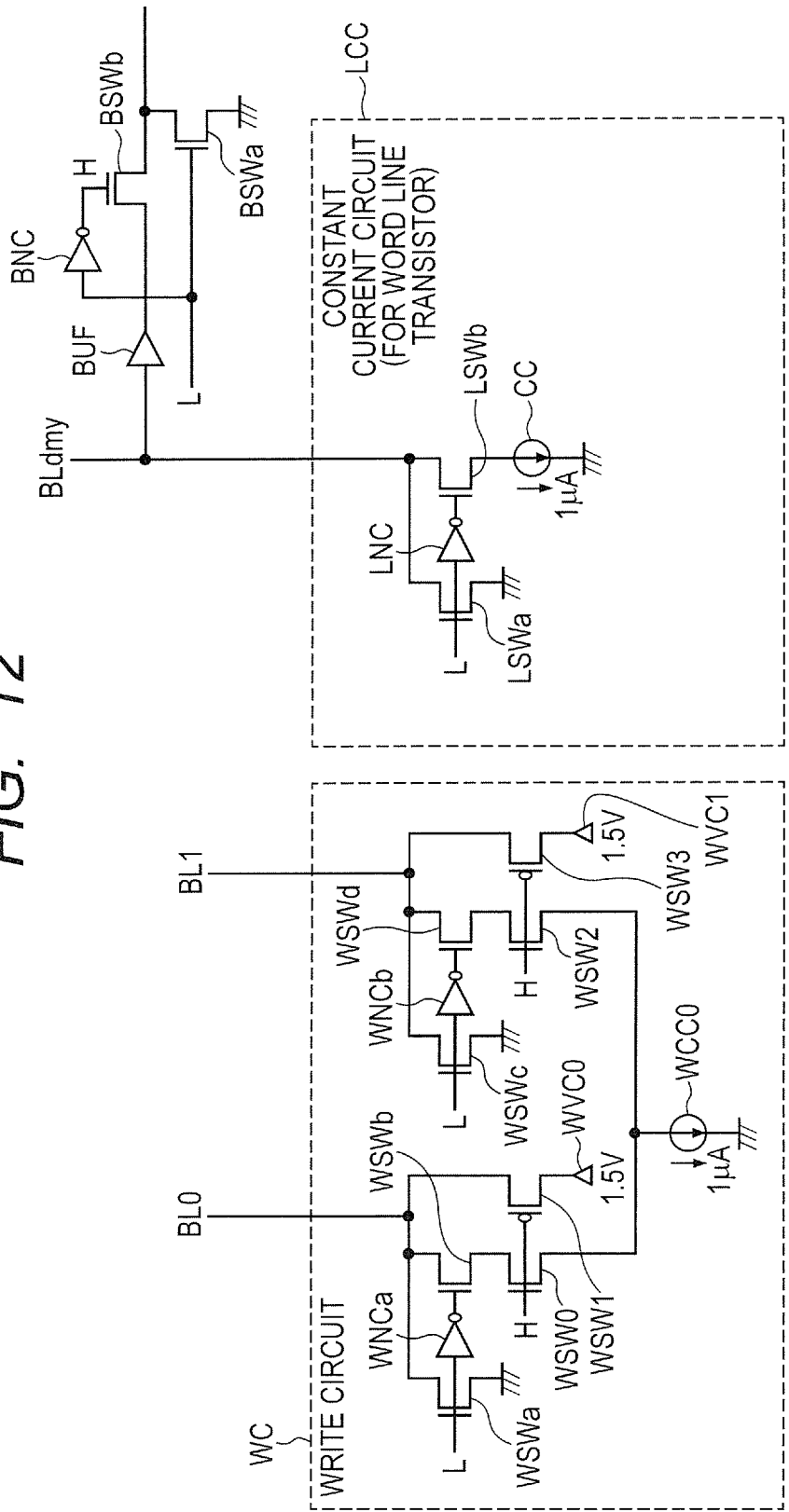
FIG. 12 is a diagram illustrating detailed configurations of a write circuit, a constant current circuit, and a voltage buffer circuit in accordance with the third embodiment.

As regards the dummy bit line BLdmy, more specifically, the constant current circuit LCC further includes switches LSWa, LSWb and an inverter LNC, as indicated in FIG. 12. The dummy bit line BLdmy is coupled to the ground through the switch LSWa, and coupled to the current source circuit CC through the switch LSWb. The current source circuit CC is coupled to the ground. That is to say, the dummy bit line BLdmy is coupled to the ground through the switch LSWb and the current source circuit CC.

The switch LSWa and the switch LSWb turn on exclusively. More specifically, when applying a low-level voltage to the dummy bit line BLdmy, the constant current circuit LCC turns on the switch LSWa and turns off the switch LSWb. This electrically couples the ground to the dummy bit line BLdmy and electrically uncouples the current source circuit CC from the dummy bit line BLdmy. Thus, the low-level voltage (0 V) is applied to the dummy bit line BLdmy. Meanwhile, when applying a constant current to the dummy bit line BLdmy, the constant current circuit LCC turns off the switch LSWa and turns on the switch LSWb. This electrically uncouples the ground from the dummy bit line BLdmy and electrically couples the current source circuit CC to the dummy bit line BLdmy. Thus, the constant current (1 µA) is applied to the dummy bit line BLdmy.

For example, the switch LSWa and the switch LSWb are n-type MOS transistors. The inverter LNC inputs a gate voltage that is applied to the switch LSWa. The inverter LNC inverts the logic level of the inputted gate voltage and applies the inverted gate voltage to the switch LSWb. As a result, the switch LSWa and the switch LSWb can be turned on exclusively as mentioned above.

The source lines SL0, SL1 and the bit lines BL0, BL1 will not be described here because they are the same as described in conjunction with the first embodiment with reference to FIG. 5.

Figure 11:
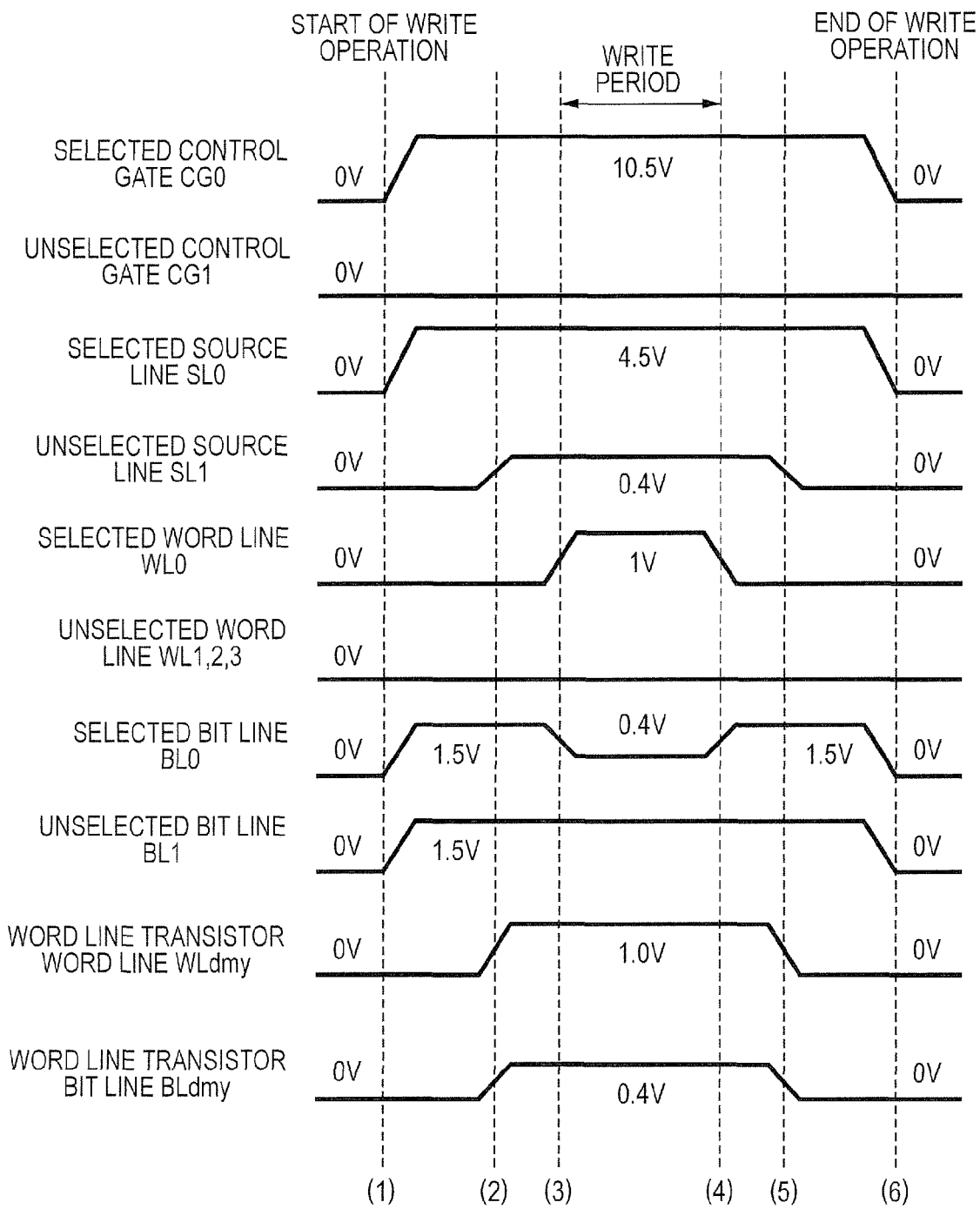
FIG. 11 is a timing diagram illustrating a write operation of the semiconductor memory device according to the third embodiment.

First Timing ((1) in FIG. 11)

At the beginning of a write operation, the voltages of the selected control gate line CG0, selected source line SL0, and bit lines BL0, BL1 change in the same manner as in the first embodiment.

Second Timing ((2) in FIG. 11)

The voltage of the dummy word line WLdmy0 changes in the same manner as in the first embodiment. The constant current circuit LCC finishes applying a low-level voltage (0 V) to the dummy bit line BLdmy, and starts applying a constant current (1 µA) to the dummy bit line BLdmy. In this instance, the dummy bit line BLdmy has a voltage of 0.4 V, which is obtained by subtracting the threshold voltage (0.6 V; "Vgs" in FIG. 1) of the word line transistor WLT from the voltage (1.0V; "VWLdmy0" in FIG. 1) of the dummy word line WLdmy0. Then, as is the case with the first embodiment, the semiconductor memory device 3 turns off the switch BSWa and turns on the switch BSWb to finish applying the ground voltage (0 V) to the unselected source line SL1 and start applying the voltage (0.4 V) of the dummy bit line BLdmy to the unselected source line SL1 through the voltage buffer circuit BUF and the source line driver SLDRV1.

Third Timing ((3) in FIG. 11)

The voltages of the selected word line WL0 and selected bit line BL0 change in the same manner as in the first embodiment.

In the third embodiment, too, the unselected source line SL1 has the same voltage (0.4 V) as the dummy bit line BLdmy. Thus, the selected bit line BL0 coupled to the unselected memory cells MC2, MC3 has the same voltage (0.4 V) as the unselected source line SL1 coupled to the unselected memory cells MC2, MC3. Consequently, the subthreshold leak current in the unselected memory cells MC2, MC3 can be eliminated.

Further, the voltage difference between the voltage (1.5 V) of the unselected bit line BL1 coupled to the unselected memory cells MC6, MC7 and the voltage (0.4 V) of the unselected source line SL1 coupled to the unselected memory cells MC6, MC7 is reduced. Additionally, the threshold voltage of the unselected memory cells MC6, MC7 is increased by the substrate bias effect that is produced when a voltage is applied to the source line SL1. Consequently, the subthreshold leak current in the unselected memory cells MC6, MC7 can be reduced.

Fourth Timing ((4) in FIG. 11)

The voltages of the selected word line WL0 and selected bit line BL0 change in the same manner as in the first embodiment.

Fifth Timing ((5) in FIG. 11)

The voltages of the dummy word line WLdmy0 and unselected source line SL1 change in the same manner as in the first embodiment. The constant current circuit LCC finishes applying a constant current (1 µA) to the dummy bit line BLdmy and starts applying a low-level voltage (0 V) to the dummy bit line BLdmy.

Sixth Timing ((6) in FIG. 11)

The voltages of the selected control gate line CG0, selected source line SL0, and bit lines BL0, BL1 change in the same manner as in the first embodiment.

Modification of Third Embodiment

The above description relates to a case where the application of a high-level voltage to the dummy word line WLdmy0 starts at the second timing after the voltage levels, for example, of the bit lines BL0, BL1 are changed at the first timing. However, the third embodiment is not limited to such an operation. As described below with reference to FIG. 13, a high-level voltage (1 V) may alternatively be applied to the dummy word line WLdmy0 at the first to sixth timings. Such an alternative operation is described below by indicating the difference from the operation described with reference to FIG. 11 for brevity of explanation.

Figure 13:
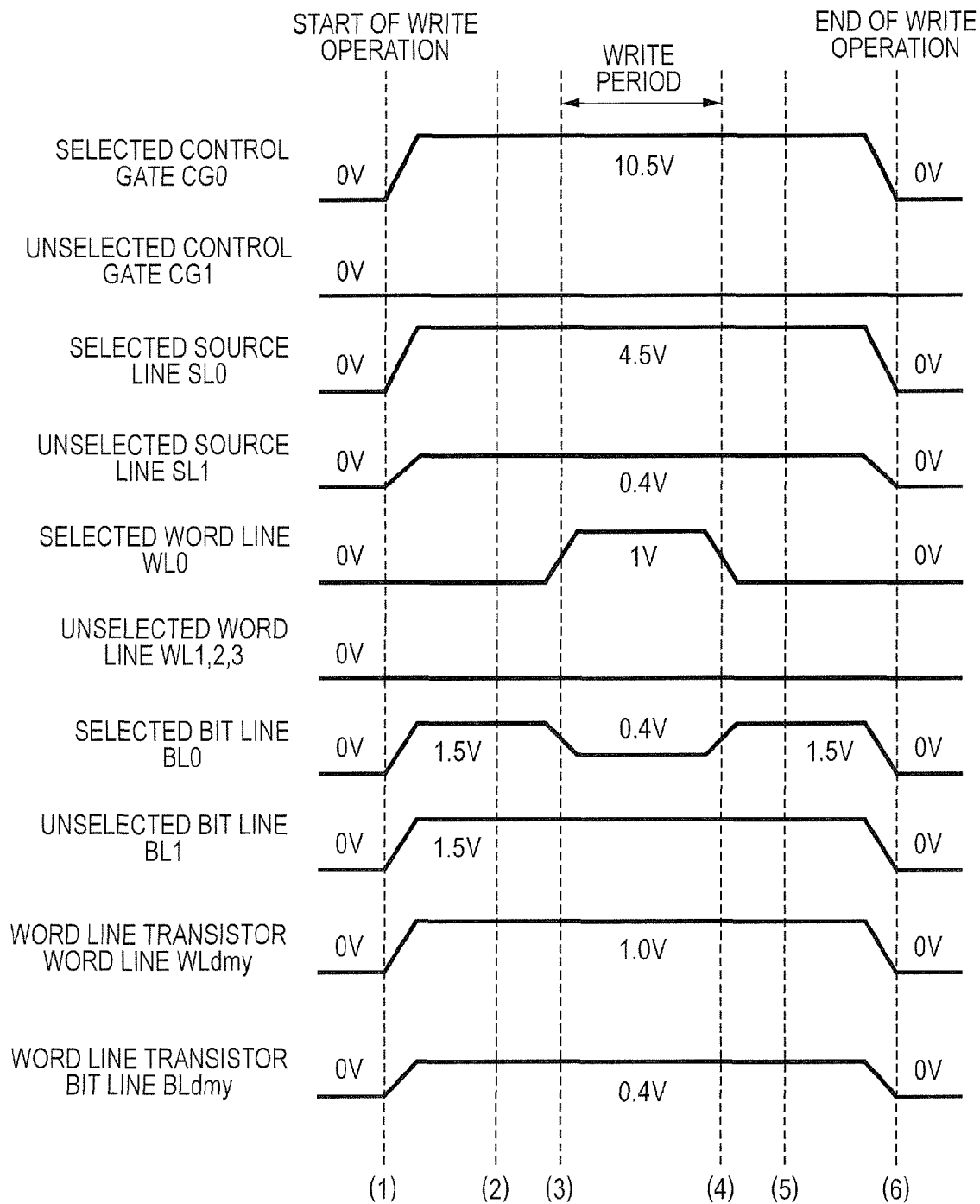
FIG. 13 is a timing diagram illustrating a write operation of the semiconductor memory device according to a modification of the third embodiment.

First Timing ((1) in FIG. 13)

The word line driver WLDRVdmy0 finishes applying a low-level voltage (0 V) to the dummy word line WLdmy0 and starts applying a high-level voltage (1.0V) to the dummy word line WLdmy0. The constant current circuit LCC finishes applying a low-level voltage (0 V) to the dummy bit line BLdmy and starts applying a constant current (1 µA) to the dummy bit line BLdmy. Further, the semiconductor memory device 3 turns off the switch BSWa and turns on the switch BSWb. As a result, as is the case with the earlier-described operation, the dummy bit line BLdmy and the unselected source line SL1 have a voltage (0.4 V) that is obtained by subtracting the threshold voltage (0.6 V) of the word line transistor WLT from the voltage (1.0 V) of the dummy word line WLdmy0.

Sixth Timing ((6) in FIG. 13)

The word line driver WLDRVdmy0 finishes applying a high-level voltage (1.0 V) to the dummy word line WLdmy0 and starts applying a low-level voltage (0 V) to the dummy word line WLdmy0. Further, the semiconductor memory device 3 turns on the switch BSWa and turns off the switch BSWb. The voltage of the unselected source line SL1 is then equal to the ground voltage (0 V). The constant current circuit LCC finishes applying a constant current (1 µA) to the dummy bit line BLdmy and starts applying a low-level voltage (0 V) to the dummy bit line BLdmy.

Consequently, no control signal needs to be outputted from the control circuit in order to apply a voltage or current change at the second timing ((2) in FIG. 11) and at the fifth timing ((5) in FIG. 11). Therefore, the configuration of the control circuit can be simplified.

Advantageous Effects of Third Embodiment

As described above, the word line transistor WLT in the third embodiment is not a transistor included in a memory cell. When data is to be written into the memory cell MC0, the voltage applied to the dummy word line WLdmy0 coupled to the word line transistor WLT is lower than the voltage applied to a control gate line coupled to the memory transistor MT0 in the memory cell MC0.

During a write operation in the first and second embodiments, a high voltage (10.5 V) required for the write operation is constantly applied to the gates of the dummy memory cells MCdmy0, MCdmy1. During the write operation, the dummy memory cells remain in a state where hot electrons are generated by the high voltage applied for a write. When the hot electrons are trapped into a gate oxide film of a selection transistor, the threshold value of the selection changes. Such a threshold value change also occurs in normal memory cells due to the hot electrons. However, the dummy memory cells are more significantly affected because the high voltage is applied to the dummy memory cells for a longer period of time than to the normal memory cells due to the difference between the number of dummy memory cells and the number of normal memory cells.

In the above instance, the voltage of the dummy bit line BLdmy, that is, the voltage of the unselected source line SL1, is different from the voltage of a selected bit line used for a write. Consequently, an intended leak current elimination effect cannot be produced.

Meanwhile, the third embodiment does not apply a high voltage to the word line transistor WLT. Therefore, the influence of characteristics changes caused by hot electrons can be suppressed.

Fourth Embodiment

Configuration of Fourth Embodiment

A fourth embodiment of the present invention will now be described with reference to the accompanying drawings. Elements identical with the corresponding elements in the first embodiment are, for example, designated by the same reference numerals as the corresponding elements, and will not be redundantly described. First of all, a configuration of a semiconductor memory device 4 according to the fourth embodiment will be described with reference to FIG. 14.

Figure 14:
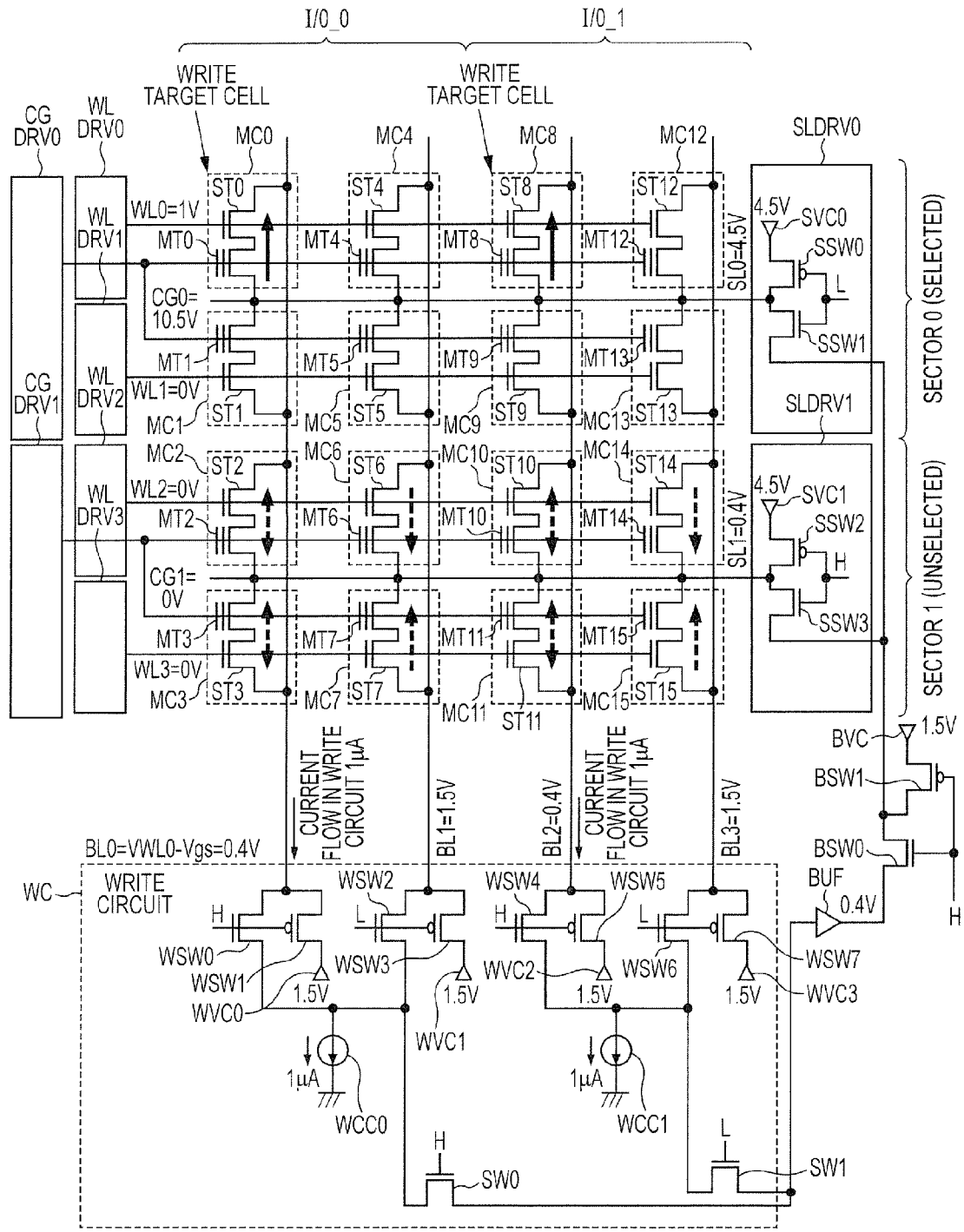
FIG. 14 is a diagram illustrating a configuration of the semiconductor memory device according to a fourth embodiment of the present invention.

As illustrated in FIG. 14, the semiconductor memory device 4 according to the fourth embodiment is different from the semiconductor memory device 1 according to the first embodiment in that the former does not include the word line driver WLDRVdmy, the control gate line driver CGDRVdmy, and the source line driver SLDRVdmy.

Further, the semiconductor memory device 4 does not include the dummy word line WLdmy0, the dummy control gate line CGdmy, the dummy source line SLdmy, and the dummy bit line BLdmy. Thus, the first and second terminals of each dummy memory cell are coupled to the ground, and the third terminal is placed in the floating state. It should be noted that the dummy memory cells are not shown in the drawings of the fourth embodiment.

In the fourth embodiment, memory cells MC8-MC15 are expressly used as additional memory areas. Accordingly, bit lines BL2, BL3 are also expressly used. Further, the voltage buffer circuit BUF in the fourth embodiment is coupled to the write circuit WC and not to the dummy bit line BLdmy.

The memory cells MC8-MC11 are in the same column. The memory cells MC12-MC15 are in the same column. The memory cells MC8, MC12 are in the same row as the memory cells MC0, MC4. The memory cells MC9, MC13 are in the same row as the memory cells MC1, MC5. The memory cells MC10, MC14 are in the same row as the memory cells MC2, MC6. The memory cells MC11, MC15 are in the same row as the memory cells MC3, MC7.

Consequently, the control gate line CG0 is coupled to the first terminals of the memory transistors MT8, MT9, MT12, MT13 in the memory cells MC8, MC9, MC12, MC13 and to the first terminals of the memory transistors MT0, MT1, MT4, MT5 in the memory cells MC0, MC1, MC4, MC5. The control gate line CG1 is coupled to the first terminals of the memory transistors MT10, MT11, MT14, MT15 in the memory cells MC10, MC11, MC14, MC15 and to the first terminals of the memory transistors MT2, MT3, MT6, MT7 in the memory cells MC2, MC3, MC6, MC7.

The word line WL0 is coupled to the first terminals of the selection transistors ST8, ST12 in the memory cells MC8, MC12 and to the first terminals of the selection transistors ST0, ST4 in the memory cells MC0, MC4. The word line WL1 is coupled to the first terminals of the selection transistors ST9, ST13 in the memory cells MC9, MC13 and to the gates of the selection transistors ST1, ST5 in the memory cells MC1, MC5. The word line WL2 is coupled to the first terminals of the selection transistors ST10, ST14 in the memory cells MC10, MC14 and to the first terminals of the selection transistors ST2, ST6 in the memory cells MC2, MC6. The word line WL3 is coupled to the first terminals of the selection transistors ST11, ST15 in the memory cells MC11, MC15 and to the first terminals of the selection transistors ST3, ST7 in the memory cells MC3, MC7.

The source line SL2 is coupled to the second terminals of the memory transistors MT8, MT9, MT12, MT13 in the memory cells MC8, MC9, MC12, MC13 and to the second terminals of the memory transistors MT0, MT1, MT4, MT5 in the memory cells MC0, MC1, MC4, MC5. The source line SL3 is coupled to the second terminals of the memory transistors MT10, MT11, MT14, MT15 in the memory cells MC10, MC11, MC14, MC15 and to the second terminals of the memory transistors MT2, MT3, MT6, MT7 in the memory cells MC2, MC3, MC6, MC7.

The second terminals of the selection transistors ST8, ST9, ST12, ST13 in the memory cells MC8, MC9, MC12, MC13 are coupled to the source line SL0 through the memory transistors MT8, MT9, MT12, MT13, respectively. The second terminals of the selection transistors ST10, ST11, ST14, ST15 in the memory cells MC10, MC11, MC14, MC15 are coupled to the source line SL1 through the memory transistors MT10, MT11, MT14, MT15, respectively.

The third terminals of the selection transistors ST8-ST11 in the memory cells MC8-MC11 are coupled to the bit line BL2. The third terminals of the selection transistors ST12-ST15 in the memory cells MC12-MC15 are coupled to the bit line BL3.

The third terminals of the memory transistors MT8-MT11 in the memory cells MC8-MC11 are coupled to the bit line BL2 through the selection transistors ST8-ST11, respectively. The third terminals of the memory transistors MT12-MT15 in the memory cells MC12-MC15 are coupled to the bit line BL3 through the selection transistors ST12-ST15, respectively. That is to say, the second terminals of the selection transistors ST8-ST15 are coupled to the third terminals of the memory transistors MT8-MT15, respectively.

The write circuit WC according to the fourth embodiment differs from the write circuit WC according to the first embodiment in that the former is further coupled to the bit lines BL2, BL3. When writing data into one of the memory cells MC8-MC15 coupled to the bit line BL2, the write circuit WC applies, to each of the bit lines BL2, BL3, a voltage (e.g., 1.5 V) having a voltage level that does not erroneously write into the memory cells MC8-MC15. Subsequently, when writing data into none of the memory cells MC12-MC15 coupled to the bit line BL2 and writing data into one of the memory cells MC8-MC11 coupled to the bit line BL3, the write circuit WC applies a constant current (e.g., 1 µA) to the bit line BL2 and continuously applies the above-mentioned voltage to the bit line BL3. Meanwhile, when writing data into none of the memory cells MC8-MC11 coupled to the bit line BL2 and writing data into one of the memory cells MC12-MC15 coupled to the bit line BL3, the write circuit WC applies a constant current (e.g., 1 µA) to the bit line BL3 and continuously applies the above-mentioned voltage to the bit line BL2.

More specifically, the write circuit WC according to the fourth embodiment differs from the write circuit WC according to the first embodiment in that the former further includes switches WSW1-WSW7, a current source circuit WCC1, and supply voltage circuits WVC2, WVC3. The bit line BL2 is coupled to the current source circuit WCC1 through the switch WSW4, and coupled to the supply voltage circuit WVC2 through the switch WSW5. The bit line BL3 is coupled to the current source circuit WCC1 through the switch WSW6, and coupled to the supply voltage circuit WVC3 through the switch WSW7. The current source circuit WCC1 is coupled to the ground. That is to say, the bit line BL2 is coupled to the ground through the switch WSW4 and the current source circuit WCC1, and the bit line BL3 is coupled to the ground through the switch WSW6 and the current source circuit WCC1.

The switch WSW4 and the switch WSW5 turn on exclusively. That is to say, when applying a constant current to the bit line BL2, the write circuit WC turns on the switch WSW4 and turns off the switch WSW5. This electrically couples the current source circuit WCC1 to the bit line BL2 and electrically uncouples the supply voltage circuit WVC2 from the bit line BL2. Thus, a constant current (1 µA) generated by the current source circuit WCC1 is applied to the bit line BL2. Meanwhile, when applying a voltage to the bit line BL2, the write circuit WC turns off the switch WSW4 and turns on the switch WSW5. This electrically uncouples the current source circuit WCC1 from the bit line BL2 and electrically couples the supply voltage circuit WVC2 to the bit line BL2. Thus, a voltage (1.5 V) generated by the supply voltage circuit WVC2 is applied to the bit line BL2.

For example, the switch WSW4 is an n-type MOS transistor, and the switch WSW5 is a p-type MOS transistor. The switch WSW4 and the switch WSW5 can be turned on exclusively as mentioned above by applying the same gate voltage to the gate of the switch WSW4 and to the gate of the switch WSW5.

The switch WSW6 and the switch WSW7 turn on exclusively. That is to say, when applying a constant current to the bit line BL3, the write circuit WC turns on the switch WSW6 and turns off the switch WSW7. This electrically couples the current source circuit WCC1 to the bit line BL3 and electrically uncouples the supply voltage circuit WVC3 from the bit line BL3. Thus, a constant current (1 µA) generated by the current source circuit WCC1 is applied to the bit line BL3. Meanwhile, when applying a voltage to the bit line BL3, the write circuit WC turns off the switch WSW6 and turns on the switch WSW7. This electrically uncouples the current source circuit WCC1 from the bit line BL3 and electrically couples the supply voltage circuit WVC3 to the bit line BL3. Thus, a voltage (1.5 V) generated by the supply voltage circuit WVC3 is applied to the bit line BL3.

For example, the switch WSW6 is an n-type MOS transistor, and the switch WSW7 is a p-type MOS transistor. The switch WSW6 and the switch WSW7 can be turned on exclusively as mentioned above by applying the same gate voltage to the gate of the switch WSW6 and to the gate of the switch WSW7.

When writing data into one of the memory cells MC0-MC3 coupled to the bit line BL0, the write circuit WC applies the voltage of the bit line BL0 to the voltage buffer circuit BUF. When writing data into one of the memory cells MC4-MC7 coupled to the bit line BL1, the write circuit WC applies the voltage of the bit line BL1 to the voltage buffer circuit BUF. When writing data into one of the memory cells MC8-MC11 coupled to the bit line BL2, the write circuit WC applies the voltage of the bit line BL2 to the voltage buffer circuit BUF. When writing data into one of the memory cells MC12-MC15 coupled to the bit line BL3, the write circuit WC applies the voltage of the bit line BL3 to the voltage buffer circuit BUF.

More specifically, the write circuit WC according to the fourth embodiment differs from the write circuit WC according to the first embodiment in that the former further includes switches SW0, SW1. A signal line coupling the switches WSW0, WSW2 to the current source circuit WCC0 is coupled to the voltage buffer circuit BUF through the switch SW0. A signal line coupling the switches WSW4, WSW6 to the current source circuit WCC1 is coupled to the voltage buffer circuit BUF through the switch SW1.

Consequently, when applying the voltage of the bit line BL0 to the voltage buffer circuit BUF, the write circuit WC turns on the switch WSW0 and the switch SW0. This electrically couples the bit line BL0 to the voltage buffer circuit BUF so that the voltage of the bit line BL0 is applied to the voltage buffer circuit BUF. When applying the voltage of the bit line BL1 to the voltage buffer circuit BUF, the write circuit WC turns on the switch WSW2 and the switch SW0. This electrically couples the bit line BL1 to the voltage buffer circuit BUF so that the voltage of the bit line BL1 is applied to the voltage buffer circuit BUF. When applying the voltage of the bit line BL2 to the voltage buffer circuit BUF, the write circuit WC turns on the switch WSW4 and the switch SW1. This electrically couples the bit line BL2 to the voltage buffer circuit BUF so that the voltage of the bit line BL2 is applied to the voltage buffer circuit BUF. When applying the voltage of the bit line BL3 to the voltage buffer circuit BUF, the write circuit WC turns on the switch WSW6 and the switch SW1. This electrically couples the bit line BL3 to the voltage buffer circuit BUF so that the voltage of the bit line BL3 is applied to the voltage buffer circuit BUF.

For example, the switches SW0, SW1 are n-type MOS transistors. The switches SW0, SW1 can be turned on as mentioned above by applying a gate voltage to the gate of the switch SW0 and to the gate of the switch SW1.

The fourth embodiment will now be described with reference to a case where the semiconductor memory device 4 is a non-volatile memory that is multi-channel accessible. In short, the semiconductor memory device 4 is capable of writing data into a plurality of memory cells in a parallel manner. FIG. 14 depicts a case where two-channel access is permitted. The memory cells MC0-MC7 form a unit ("I/O_0" in FIG. 14) that can be written into through a first channel. The memory cells MC8-MC15 form a unit ("I/O_1" in FIG. 14) that can be written into through a second channel.

When data is to be written into a memory cell included in the I/O_0 and into a memory cell included in the I/O_1, either the switch SW0 or the switch SW1 is turned on, and then either the voltage of the selected bit line BL0 or BL1 of the I/O_0 or the voltage of the selected bit line BL2 or BL3 of the I/O_1 is applied to the source line of an unselected sector. Either the switch SW0 or the switch SW1 is turned on in order to avoid a short circuit between the bit line BL0 or BL1 and the bit line BL2 or BL3.

The fourth embodiment differs from the first embodiment in that the first sector ("sector 0" in FIG. 14) further includes the memory cells MC8, MC9, MC12, MC13, and that the second sector ("sector 1" in FIG. 14) further includes the memory cells MC10, MC11, MC14, MC15.

In marked contrast to the first to third embodiments, the fourth embodiment having the above-described configuration uses, as the voltage to be applied to the source line SL1 of an unselected memory cell, a bit line voltage generated by a selected memory cell during a write operation, instead of using the voltage of the dummy bit line BLdmy, which is generated by the dummy memory cells MCdmy0, MCdmy1 or the word line transistor WLT.

Further, in the fourth embodiment, switches BSW0, BSW1 and a supply voltage circuit BVC are expressly used to write data "1" into the memory cells MC0-MC15. Writing data "0" is an operation performed to inject electrons into a floating gate, whereas writing data "1" is an operation performed to inhibit electrons from entering the floating gate (inhibit a write). When data "0" is to be written, a constant current (1 μA) is applied to a bit line. When data "1" is to be written, a high-level voltage (1.5 V) is applied to the bit line.

The source line drivers SLDRV0, SLDRV1 are coupled to the voltage buffer circuit BUF through the switch BSW0, and coupled to the supply voltage circuit BVC through the switch BSW1. The switches BSWa, BSWb shown in FIG. 5 are coupled, for example, between the voltage buffer circuit BUF and the switch BSW0. However, the operations of the switches BSWa, BSWb will not be described here because their operations are the same as described in conjunction with the first embodiment.

The switch BSW0 and the switch BSW1 turn on exclusively. When applying a first voltage or a second voltage, as a low-level voltage, to the source line drivers SLDRV0, SLDRV1, the semiconductor memory device 4 turns on the switch BSW0 and turns off the switch BSW1. This electrically couples the ground or the voltage buffer circuit BUF to the source line drivers SLDRV0, SLDRV1 and electrically uncouples the supply voltage circuit BVC from the source line drivers SLDRV0, SLDRV1. Thus, the first voltage (0 V) or the second voltage (the voltage of the dummy bit line BLdmy that is delivered through the voltage buffer circuit BUF) is applied to the source line drivers SLDRV0, SLDRV1. Meanwhile, when applying a third voltage, as a low-level voltage, to the source line drivers SLDRV0, SLDRV1, the semiconductor memory device 4 turns off the switch BSW0 and turns on the switch BSW1. This electrically uncouples the ground and the voltage buffer circuit BUF from the source line drivers SLDRV0, SLDRV1 and electrically couples the supply voltage circuit BVC to the source line drivers SLDRV0, SLDRV1. Thus, the third voltage (1.5V) is applied to the source line drivers SLDRV0, SLDRV1.

For example, the switch BSW0 is an n-type MOS transistor, and the switch BSW1 is a p-type MOS transistor. The switches BSW0, BSW1 can be turned on exclusively as mentioned above by applying the same gate voltage to the gate of the switch BSW0 and to the gate of the switch BSW1.

Operation of Fourth Embodiment

A write operation of the semiconductor memory device 4 according to the fourth embodiment will now be described with reference to FIG. 15. The following describes an example in which data "0" is simultaneously written into the memory cell MC0 in the I/O_0 and into the memory cell MC8 in the I/O_1, as indicated in FIG. 14. Further, an example in which the memory cells MC2, MC3, MC6, MC7, MC10, MC11, MC14, MC15 are in the erased state is described.

Before a write operation, the word lines WL0-WL3, the control gate lines CG0, CG1, the source lines SL0, SL1, and the bit lines BL0, BL1 are in the same states as in the first embodiment. A low-level voltage (0 V) is applied, as a gate voltage, to the switches SW0, SW1. That is to say, the switches SW0, SW1 are off. A high-level voltage (VCC) is applied, as a gate voltage, to the switches BSW0, BSW1. That is to say, the switch BSW0 is on, and the switch BSW1 is off. This voltage VCC is higher than a later-mentioned low-level voltage (0 V) so as to be able to turn on the switch BSW0.

A low-level voltage (0 V) is also applied to the bit lines BL2, BL3 by the write circuit WC, as is the case with the bit lines BL0, BL1. That is to say, it is obvious from the description of the first to third embodiments that the bit lines BL2, BL3 of the semiconductor memory device 4 according to the fourth embodiment also require switches (transistors) and inverters for applying a low-level voltage (0 V) that correspond to the switches WSWa-WSWd and inverters WNCa, WNCb shown in FIGS. 5 and 12. Therefore, the information about such required switches (transistors) and inverters are omitted from the drawings and from the following description.

Figure 15:
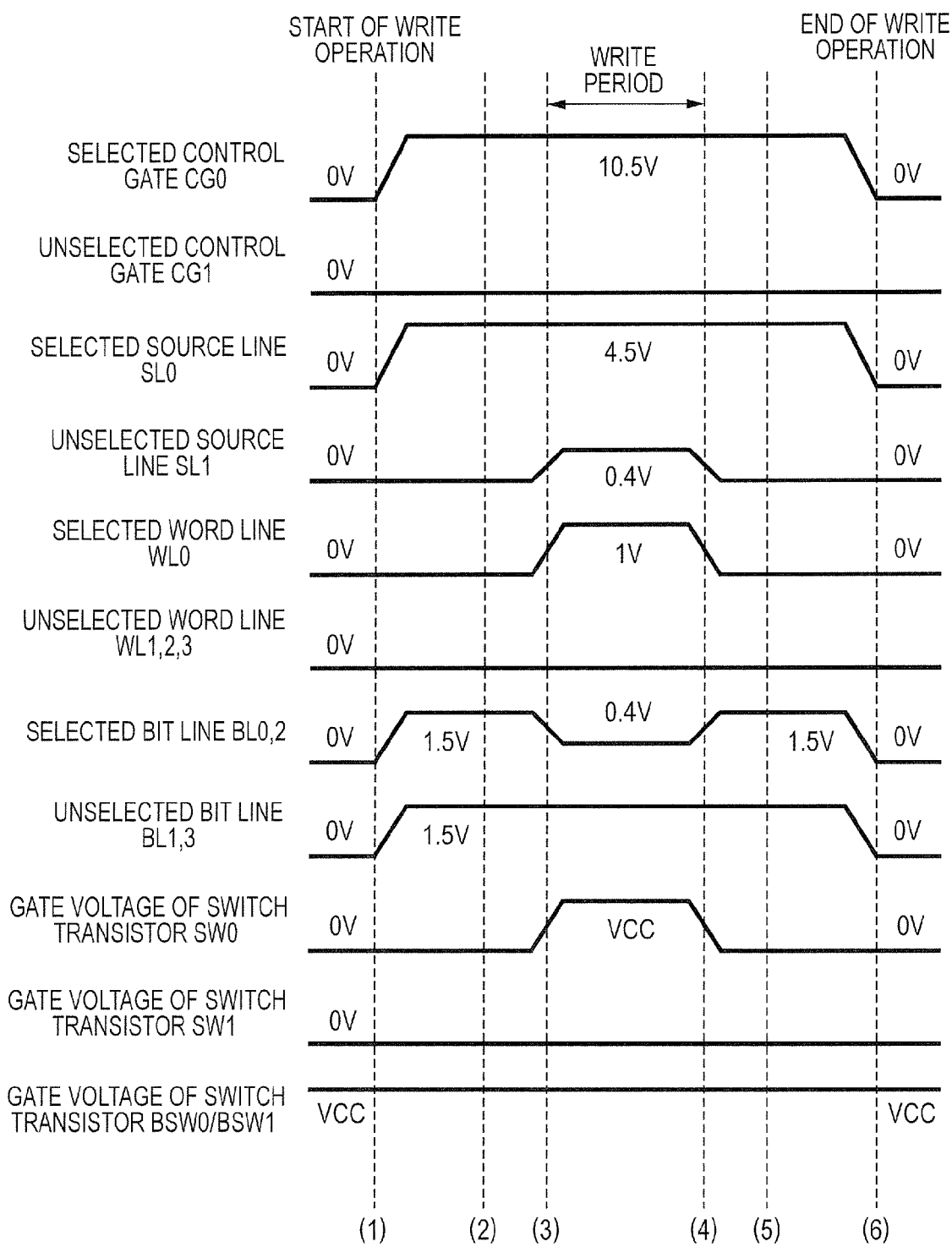
FIG. 15 is a timing diagram illustrating a write operation (a write of "0") of the semiconductor memory device according to the fourth embodiment.

First Timing ((1) in FIG. 15)

At the beginning of a write operation, the voltages of the control gate line CG0, source line SL0, and bit lines BL0, BL1 change in the same manner as in the first embodiment. In the fourth embodiment, the write circuit WC also finishes applying a low-level voltage (0 V) to the bit lines BL2, BL3, and starts applying, to the bit lines BL2, BL3, a high-level voltage (1.5 V; a voltage higher than the high-level voltage of a later-described word line) that does not erroneously write into the memory cells MC8-MC15.

Second Timing ((2) in FIG. 15)

In the fourth embodiment, the voltage of the unselected source line SL1 does not change at the second timing.

Third Timing ((3) in FIG. 15)

The voltages of the selected word line WL0 and selected bit line BL0 change in the same manner as in the first embodiment. In the fourth embodiment, the write circuit WC also finishes applying a high-level voltage (1.5 V) to the selected bit line BL2 and applies a constant current (1 μA) to the selected bit line BL2. Then, in the memory cell MC8, a current flows from the source line SL0 having a high voltage toward the bit line BL2 having a relatively low voltage. Hot electrons generated by such a current are injected into the floating gate to additionally write data into the memory cell MC8.

Here, as a gate voltage for the switch SW0, the write circuit WC finishes applying a low-level voltage (0 V) and starts applying a high-level voltage (VCC). That is to say, the write circuit WC turns on the switch SW0. The voltage VCC is higher than the above-mentioned low-level voltage (0 V) so as to be able to turn on the switch SW0. The semiconductor memory device 4 then turns off the switch BSWa and turns on the switch BSWb to finish applying the ground voltage (0 V) to the unselected source line SL1 and start applying the voltage (0.4 V) of the selected bit line BL0 to the unselected source line SL1 through the voltage buffer circuit BUF and the source line driver SLDRV1.

Here, as mentioned earlier, the voltage of the unselected source line SL1 is the same (0.4 V) as the voltage of the selected bit line BL0. Thus, the voltage of the selected bit line BL0 coupled to the unselected memory cells MC2, MC3 is the same (0.4 V) as the voltage of the unselected source line SL1 coupled to the unselected memory cells MC2, MC3. Further, the voltage of the selected bit line BL2 coupled to the unselected memory cells MC10, MC11 is also the same (0.4V) as the voltage of the source line SL1 coupled to the unselected memory cells MC10, MC11. Consequently, the subthreshold leak current in the unselected memory cells MC2, MC3, MC10, MC11 can be eliminated.

Furthermore, the voltage difference between the voltage (1.5 V) of the unselected bit line BL1 coupled to the unselected memory cells MC6, MC7 and the voltage (0.4 V) of the unselected source line SL1 coupled to the unselected memory cells MC6, MC7 is reduced. Moreover, the voltage difference between the voltage (1.5 V) of the unselected bit line BL3 coupled to the unselected memory cells MC14, MC15 and the voltage (0.4 V) of the unselected source line SL1 coupled to the unselected memory cells MC14, MC15 is reduced. Additionally, the threshold voltage of the unselected memory cells MC6, MC7, MC14, MC15 is increased by the substrate bias effect that is produced when a voltage is applied to the source line SL1. Consequently, the subthreshold leak current in the unselected memory cells MC6, MC7, mC14, MC15 can be reduced.

Fourth Timing ((4) in FIG. 15)

The voltages of the selected word line WL0 and selected bit line BL0 change in the same manner as in the first embodiment. In the fourth embodiment, the write circuit WC also applies, to the bit line BL2, a voltage (1.5 V) having a voltage level that does not erroneously write into the memory cell MC0.

As a gate voltage for the switch SW0, the write circuit WC finishes applying a high-level voltage (VCC) and starts applying a low-level voltage (0 V). That is to say, the write circuit WC turns off the switch SW0. The semiconductor memory device 4 turns on the switch BSWa and turns off the switch BSWb to finish applying the voltage (0.4V) of the selected bit line BL0 to the unselected source line SL1 and start applying a low-level voltage (0 V) to the unselected source line SL1 through the source line driver SLDRV1.

Fifth Timing ((5) in FIG. 15)

In the fourth embodiment, the voltage of the unselected source line SL1 does not change at the fifth timing.

Sixth Timing ((6) in FIG. 15)

The voltages of the control gate line CG0, selected source line SL0, and bit lines BL0, BL1 change in the same manner as in the first embodiment. In the fourth embodiment, the write circuit WC also finishes applying a high-level voltage (1.5 V) to the bit lines BL2, BL3 and starts applying a low-level voltage (0 V) to the bit lines BL2, BL3.

A case where data "1" is written into all the I/Os (channels) of the semiconductor memory device 4 according to the fourth embodiment will now be described with reference to FIG. 16. The following describes an example in which data "1" is simultaneously written into the memory cell MC0 in the I/O_0 and into the memory cell MC8 in the I/O_1. Further, an example in which the memory cells MC2, MC3, MC6, MC7, MC10, MC11, MC14, MC15 are in the erased state is described.

Before a write operation, the word lines WL0-WL3, the control gate lines CG0, CG1, the source lines SL0, SL1, and the bit lines BL0, BL1 are in the same states as before the earlier-described write operation (a write of "0"). The switches SW0, SW1, BSW0, BSW1 are also in the same states as before the earlier-described write operation (a write of "0").

Figure 16:
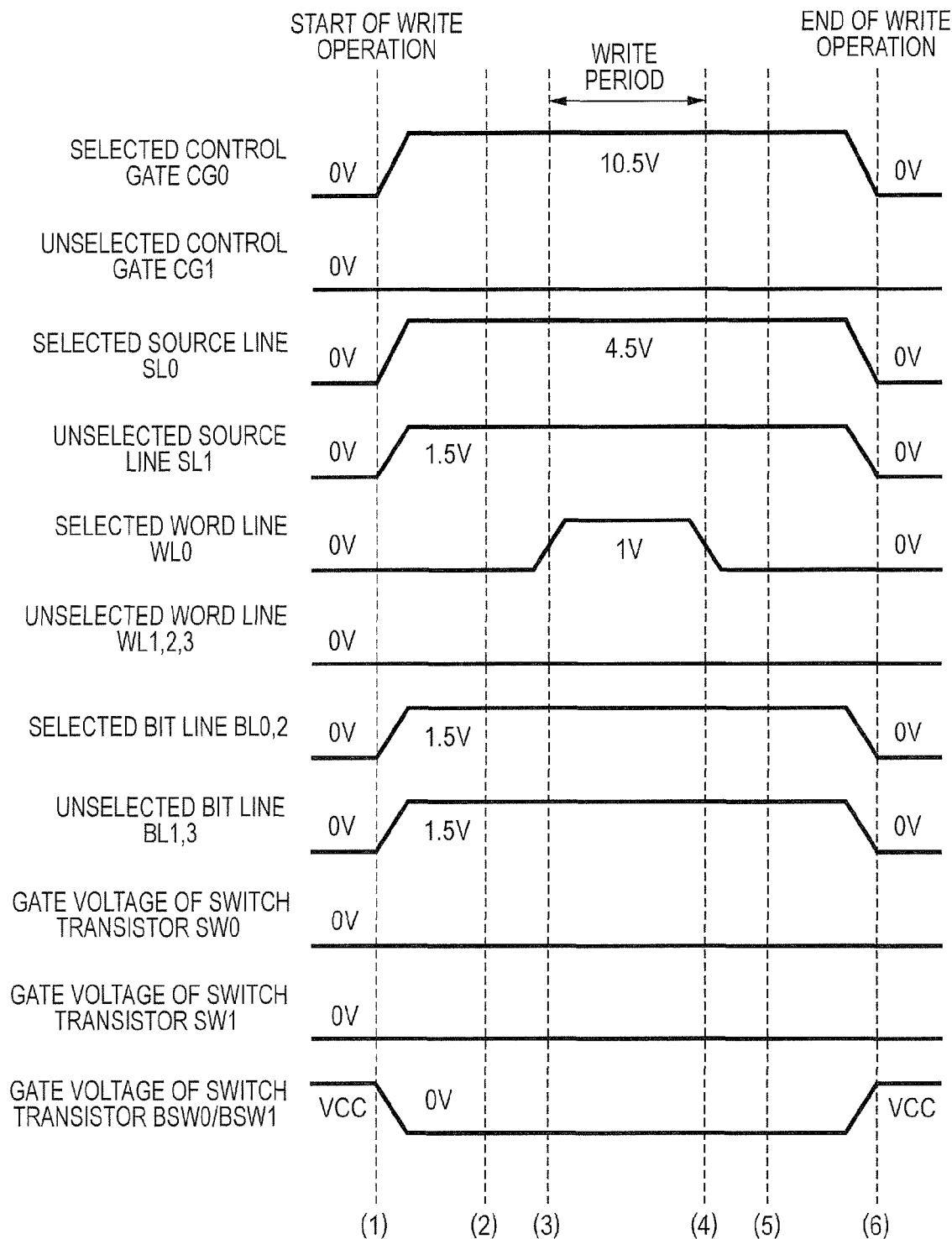
FIG. 16 is a timing diagram illustrating a write operation (a write of "1") of the semiconductor memory device according to the fourth embodiment.

First Timing ((1) in FIG. 16)

At the beginning of a write operation, the voltages of the control gate line CG0, source line SL0, and bit lines BL0-BL3 change in the same manner as before the earlier-described write operation (a write of "0"). In the fourth embodiment, the semiconductor memory device 4 finishes applying a high-level voltage (VCC) to the switches BSW0, BSW1, and starts applying a low-level voltage (0 V) to the switches BSW0, BSW1. This turns off the switch BSW0 and turns on the switch BSW1 to finish applying the first voltage (0 V) to the unselected source line SL1 and start applying the third voltage (1.5 V) to the unselected source line SL1.
Second Timing ((2) in FIG. 16)
No signal line voltage changes at the second timing.
Third Timing ((3) in FIG. 16)
The word line drivers WLDRV0, WLDRV2 finish applying a low-level voltage (0 V) to the selected word lines WL0, WL2 and start applying a high-level voltage (1.0 V) to the selected word lines WL0, WL2. This writes data "1" into the memory cells MC0, MC8.
Here, the voltages of the bit lines BL0-BL3 coupled to the unselected memory cells MC2, MC3, MC6, MC7, MC10, MC11, MC14, MC15 are the same (1.5 V) as the voltage of the unselected source line SL1 coupled to the unselected memory cells MC2, MC3, MC6, MC7, MC10, MC11, MC14, MC15. Therefore, the subthreshold leak current in the unselected memory cells MC2, MC3, MC6, MC7, MC10, MC11, MC14, MC15 can be eliminated.
Fourth Timing ((4) in FIG. 16)
The word line drivers WLDRV0, WLDRV2 finish applying a high-level voltage (1.0 V) to the selected word lines WL0, WL2 and start applying a low-level voltage (0 V) to the selected word lines WL0, WL2.
Fifth Timing ((5) in FIG. 16)
No signal line voltage changes at the fifth timing.
Sixth Timing ((6) in FIG. 16)
The voltages of the control gate line CG0, source line SL0, and bit lines BL0-BL3 change in the same manner as before the earlier-described write operation (a write of "0"). In the fourth embodiment, the semiconductor memory device 4 finishes applying a low-level voltage (0 V) to the switches BSW0, BSW1, and starts applying a high-level voltage (VCC) to the switches BSW0, BSW1. This turns on the switch BSW0 and turns off the switch BSW1 to finish applying the third voltage (1.5 V) to the unselected source line SL1 and start applying the first voltage (0 V) to the unselected source line SL1.

In the first to third embodiments, data "1" can be written by applying a bit line voltage generated by the dummy memory cells MCdmy0, MCdmy1 or by the word line transistor WLT to an unselected source line. Therefore, the switches BSW0, BSW1 used in the fourth embodiment are not necessary for the first to third embodiments.

Advantageous Effects of Fourth Embodiment

As described above, when data "0" is to be written into the memory cell MC0, the fourth embodiment couples the bit line BL0 of the memory cell MC0 to the source line SL1.
Consequently, neither the dummy memory cells MCdmy0, MCdmy1 nor the word line transistor WLT need be used to apply a voltage to the unselected source line SL1. Further, the word line drivers WLDRVdmy0, WLDRVdmy1 for the dummy memory cells MCdmy0, MCdmy1 or the word line transistor WLT, the control gate line driver CGDRVdmy, the source line driver SLDRVdmy, and the write circuit WCdmy are not required either. Therefore, the area of a semiconductor chip can be reduced. Furthermore, no influence is exerted by characteristics changes caused by hot electrons that are generated when a high voltage is continuously applied to a dummy memory cell during a write operation as described in conjunction with the third embodiment.

Moreover, when data "1" is to be written into the memory cell MC0, the fourth embodiment applies, to the unselected source line SL1, the same voltage as the high-level voltages of the selected bit lines BL0, BL2. As a source line and bit line coupled to the memory cells MC2, MC3, MC6, MC7, MC10, MC11, MC14, MC15 in an unselected sector have the same voltage, the subthreshold leak current in the unselected memory cells MC2, MC3, MC6, MC7, MC10, MC11, MC14, MC15 can be eliminated.

Schematic Configuration of Embodiments

A configuration of a semiconductor memory device 10 representing a schematic configuration of the semiconductor memory devices 1-3 according to the first to third embodiments described above will now be described with reference to FIG. 17. A part of a characteristic configuration of the semiconductor memory devices 1-3 according to the first to third embodiments is extracted as illustrated in FIG. 12.

Figure 17:
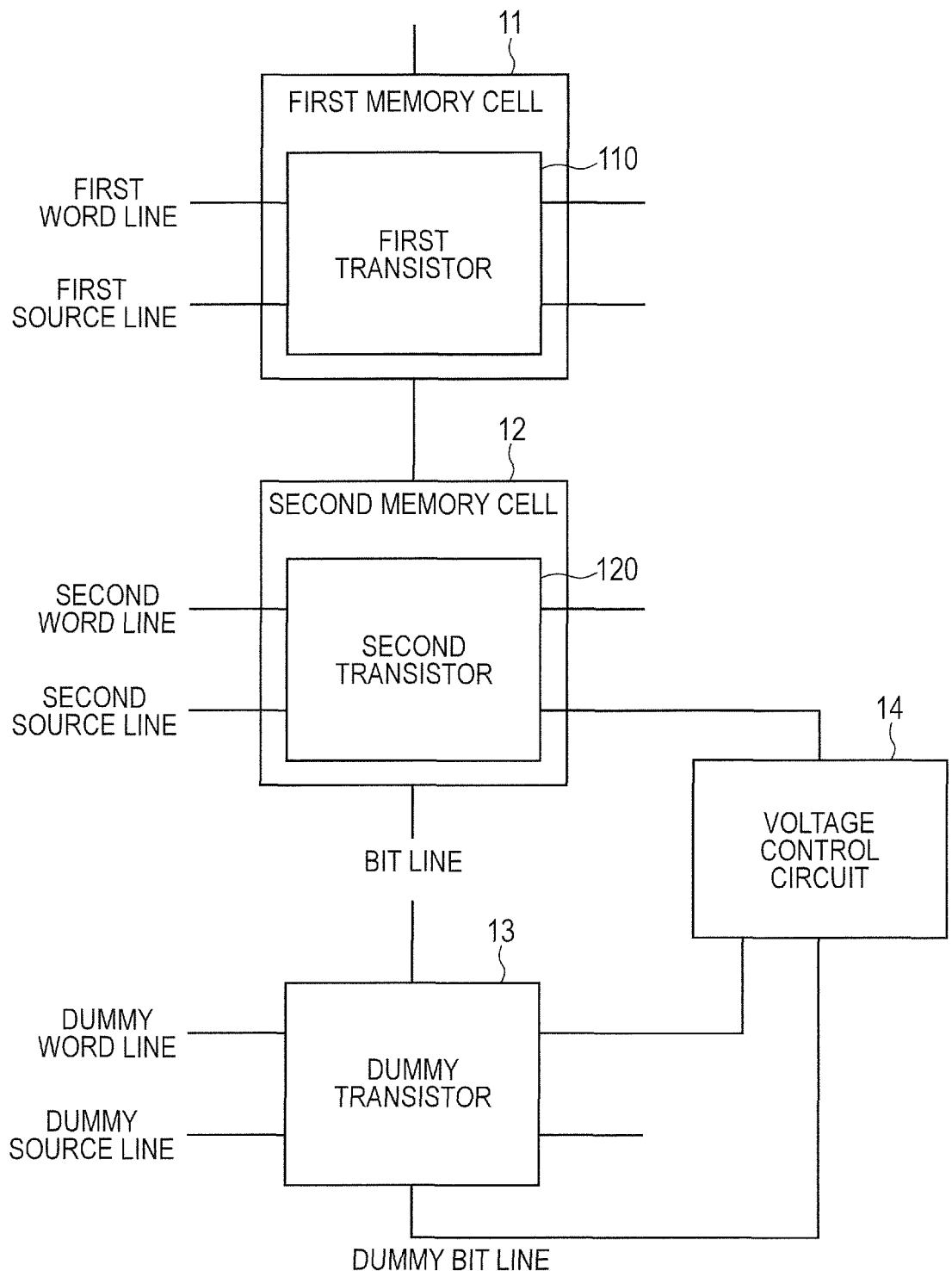
FIG. 17 is a schematic diagram illustrating a configuration of the semiconductor memory device according to the first, second, or third embodiment.

As illustrated in FIG. 17, the semiconductor memory device 10 includes a first memory cell 11, a second memory cell 12, a first dummy transistor 13, and a voltage control circuit 14.

The first memory cell 11 includes a first transistor 110. The first transistor 110 is coupled to a first word line, a first source line, and a bit line. The first memory cell 11 corresponds to one of the memory cells MC0-MC7 (the memory cell MC0 in the earlier-described example).

The second memory cell 12 includes a second transistor 120. The second transistor 120 is coupled to a second word line, a second source line, and the above-mentioned bit line. The second memory cell 12 corresponds to one of the memory cells MC0-MC7 (the memory cell MC2 in the earlier-described example).

The first dummy transistor 13 has the same structure as the first transistor 110. The first dummy transistor 13 is coupled to a dummy word line, a dummy source line, and a dummy bit line. The first dummy transistor 13 corresponds to either one of the memory transistors MTdmy0, MTdmy1 (the memory transistor MTdmy0 in the earlier-described example) or to the word line transistor WLT.

When a predetermined voltage for writing data into the first memory cell 11 is to be applied to the first word line, the voltage control circuit 14 couples the dummy bit line to the second source line. The voltage control circuit 14 applies the predetermined voltage to the dummy word line. The voltage control circuit 14 corresponds to the drivers WLDRV1-WLDRV3, WLDRVdmy0, WLDRVdmy1, CGDRV0, CGDRV1, CGDRVdmy, SLDRV0, SLDRV1, SLDRVdmy, the write circuits WC, WCdmy, and the constant current circuit LCC.

A configuration of a semiconductor memory device 20 representing a schematic configuration of the semiconductor memory device 4 according to the fourth embodiment described above will now be described with reference to FIG. 18. A part of a characteristic configuration of the semiconductor memory device 4 according to the fourth embodiment is extracted as illustrated in FIG. 13.

Figure 18:
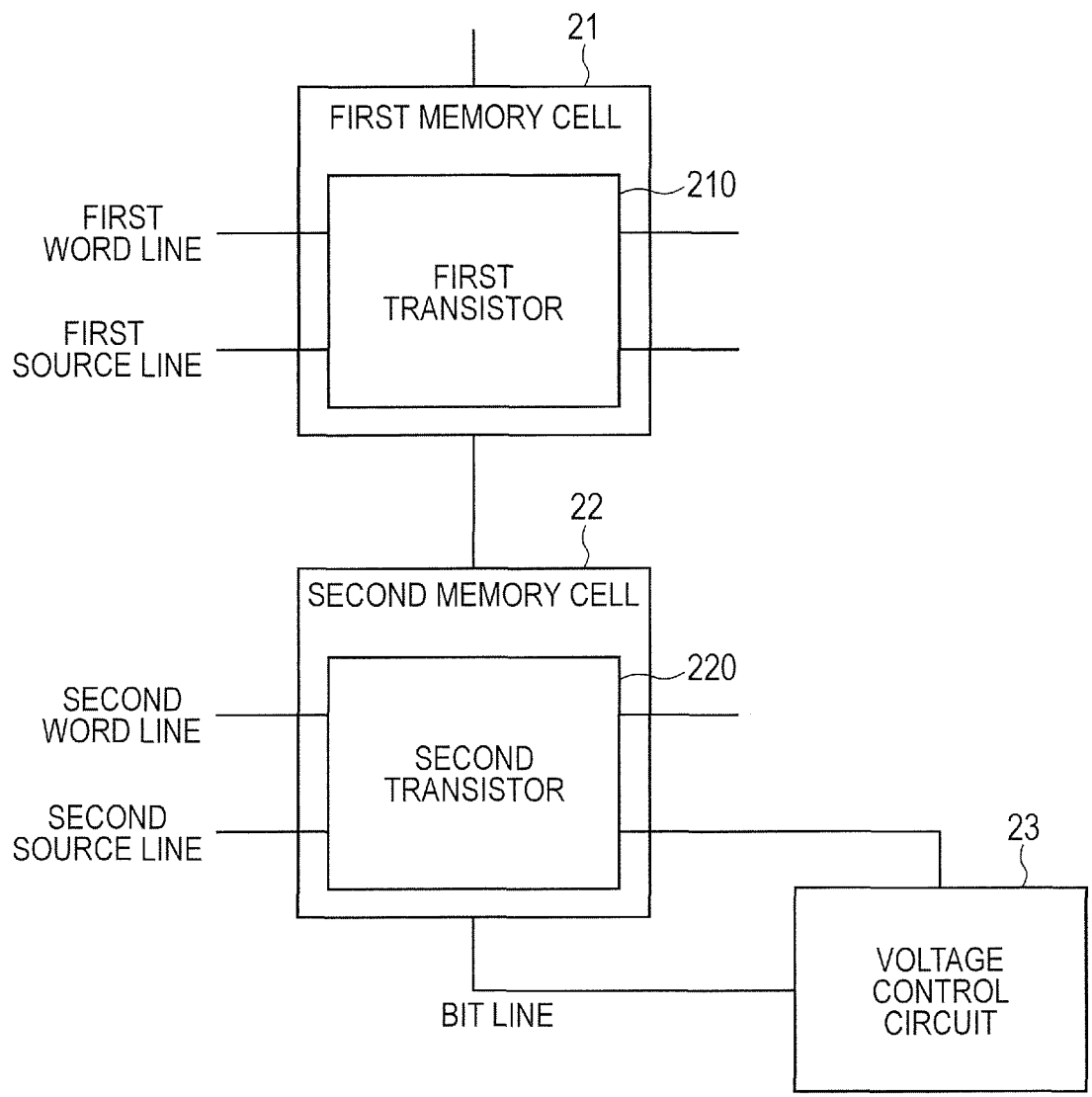
FIG. 18 is a schematic diagram illustrating a configuration of the semiconductor memory device according to the fourth embodiment.
Figure 19:
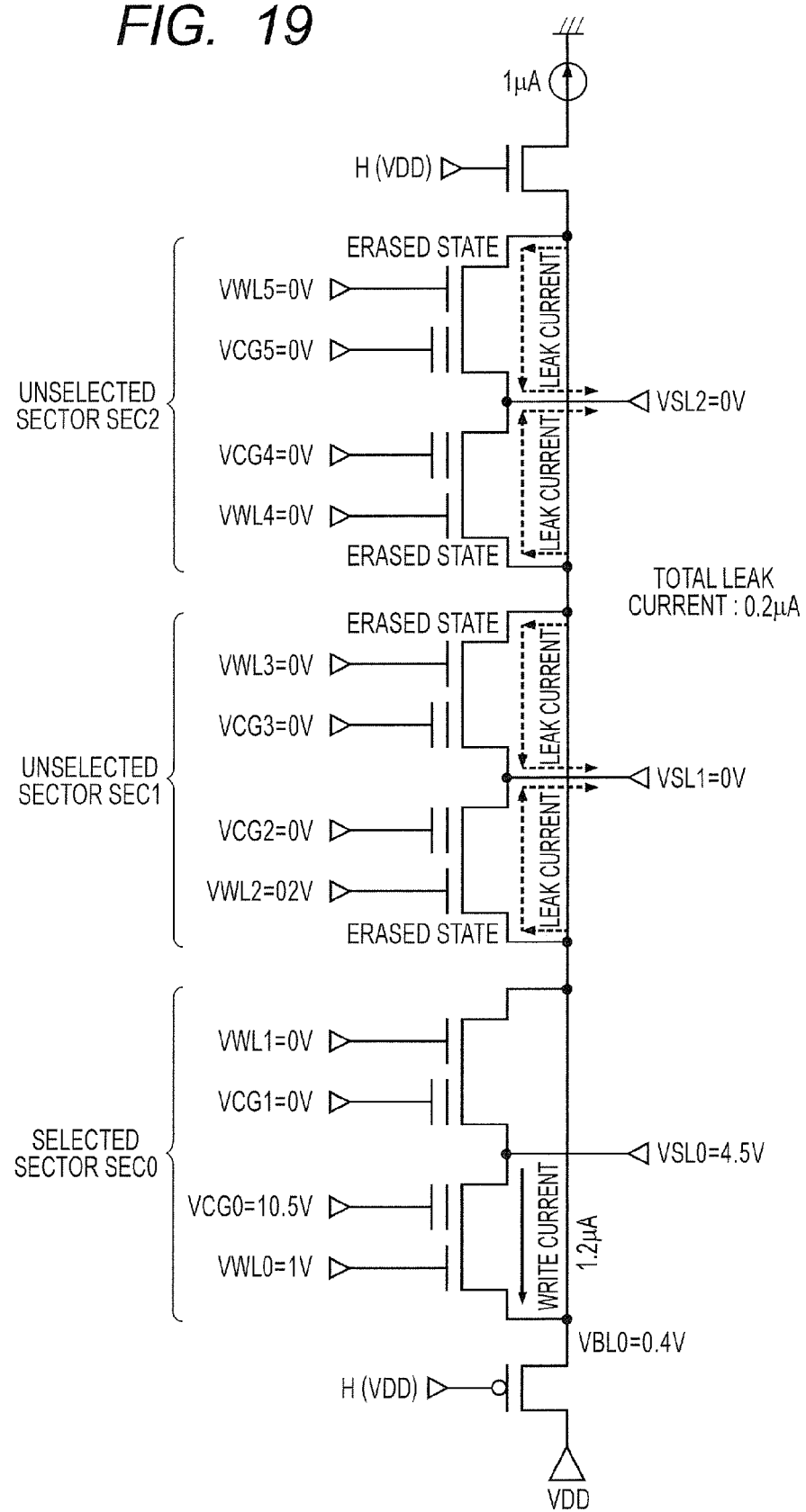
FIG. 19 is a diagram illustrating a semiconductor memory device according to a first comparative example.
Figure 20:
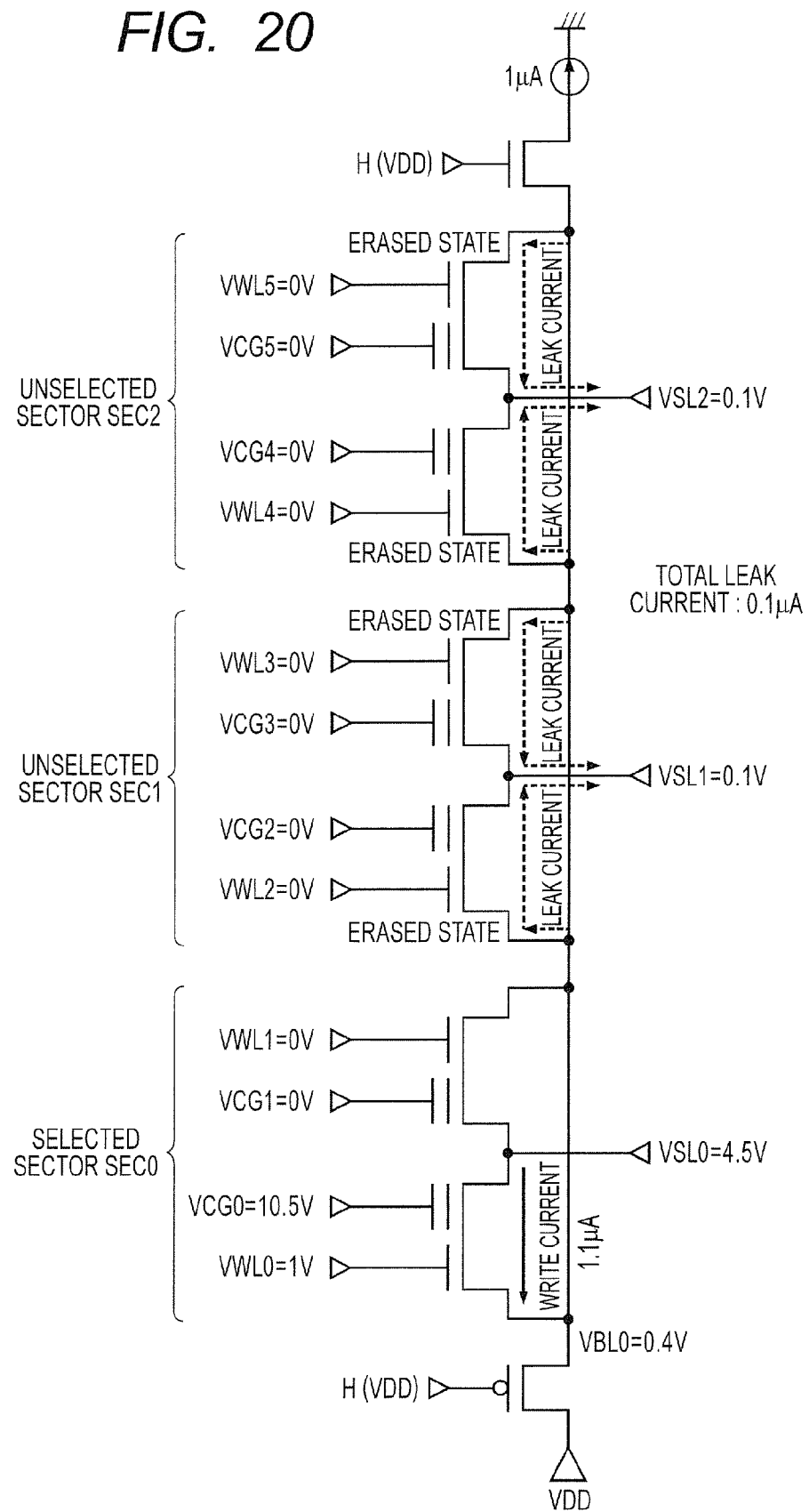
FIG. 20 is a diagram illustrating a semiconductor memory device according to a second comparative example.
Figure 21:
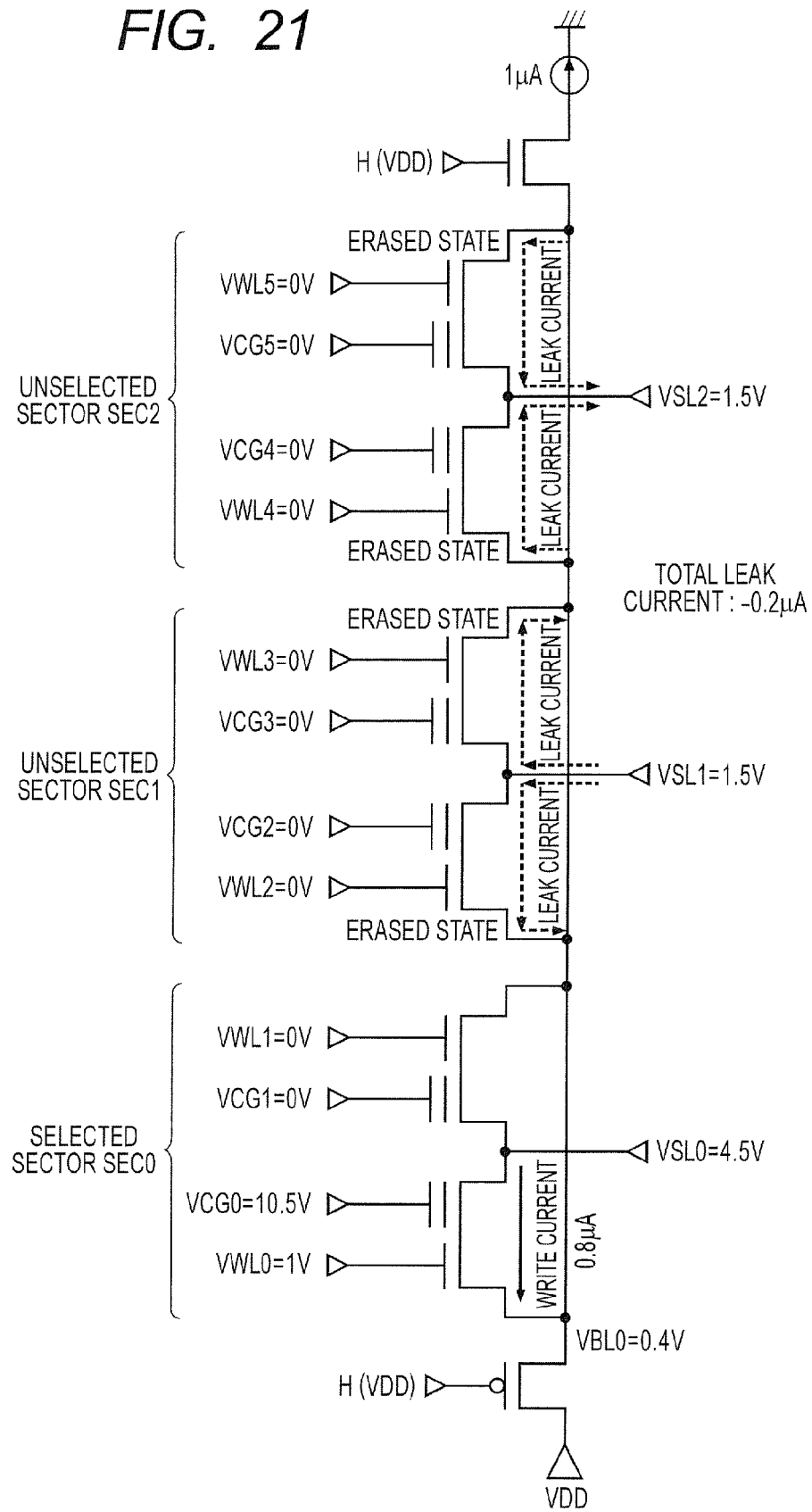
FIG. 21 is a diagram illustrating a semiconductor memory device according to a third comparative example.

As illustrated in FIG. 18, the semiconductor memory device 20 includes a first memory cell 21, a second memory cell 22, and a voltage control circuit 23.

The first memory cell 21 includes a first transistor 210. The first transistor 210 is coupled to a first word line, a first source line, and a bit line. The first memory cell 21 corresponds to one of the memory cells MC0-MC15 (the memory cell MC0 or memory cell MC8 in the earlier-described example).

The second memory cell 22 includes a second transistor 220. The second transistor 220 is coupled to a second word line, a second source line, and the above-mentioned bit line. The second memory cell 22 corresponds to one of the memory cells MC0-MC15 (the memory cell MC2 or memory cell MC10 in the earlier-described example).

When writing data into the first memory cell 21, the voltage control circuit 23 couples the bit line to the second source line. The voltage control circuit 23 corresponds to the drivers WLDRV1-WLDRV3, CGDRV0, CGDRV1, SLDRV0, SLDRV1 and the write circuit WC.

While the present invention made by its inventors has been described in detail with reference to embodiments, the present invention is not limited to the foregoing embodiments. It is to be understood by those skilled in the art that various modifications can be made without departing from the spirit and scope of the present invention.

What is claimed is:

1. A semiconductor memory device comprising:
    a first memory cell having a first transistor that is coupled to a first word line, a first source line, and a first bit line;
    a second memory cell having a second transistor that is coupled to a second word line, a second source line, and the first bit line;
    a first dummy transistor that has the same structure as the first transistor and is coupled to a first dummy word line, a dummy source line, and a dummy bit line; and
    a voltage control circuit that, when a predetermined voltage for writing data into the first memory cell is to be applied to the first word line, couples the dummy bit line to the second source line and applies the predetermined voltage to the first dummy word line.

2. The semiconductor memory device according to claim 1, further comprising:
    a third memory cell having a third transistor that is coupled to the second word line, the second source line, and a second bit line,
    wherein, when data is to be written into the first memory cell, the voltage control circuit applies, to the second bit line, a predetermined voltage for preventing an erroneous write into the third memory cell.

3. The semiconductor memory device according to claim 2, further comprising:
    a first dummy memory cell that has the same structure as the first memory cell and includes the first dummy transistor.

4. The semiconductor memory device according to claim 3,
    wherein the voltage control circuit includes:
        a first selection circuit that selects either one of a first supply voltage circuit and a first current source circuit and couples the selected circuit to the first bit line;
        a second selection circuit that selects either one of a second supply voltage circuit and the first current source circuit and couples the selected circuit to the second bit line, the second supply voltage circuit generating the same level of voltage as the first supply voltage circuit; and
        a third selection circuit that selects either one of a third supply voltage circuit and a second current source circuit and couples the selected circuit to the dummy bit line, the third supply voltage circuit generating the same level of voltage as the first supply voltage circuit, the second current source circuit generating the same amount of current as the first current source circuit, and
    wherein, when data is to be written into the first memory cell, the voltage control circuit causes the first selection circuit to select the first current source circuit, causes the second selection circuit to select the second supply voltage circuit, and causes the third selection circuit to select the second current source circuit.

5. The semiconductor memory device according to claim 3, further comprising:
    a fourth memory cell having a third transistor that is coupled to a third word line, the first source line, and the first bit line; and
    a second dummy memory cell that has the same structure as the third memory cell and includes a second dummy transistor that is coupled to a second dummy word line, the dummy source line, and the dummy bit line,
    wherein, in a memory cell array, the first memory cell and the first dummy memory cell are disposed in an odd-numbered row, and the fourth memory cell and the second dummy memory cell are disposed in an even-numbered row, and
    wherein, when a predetermined voltage for writing data into the fourth memory cell is to be applied to the third word line, the voltage control circuit couples the dummy bit line to the second source line and applies the predetermined voltage to the second dummy word line.

6. The semiconductor memory device according to claim 2,
    wherein the first memory cell further includes a first control gate line, the first source line, and a first memory transistor, the first memory transistor being coupled to the first bit line through the first transistor,
    wherein the first transistor is a first selection transistor that is coupled to the first source line through the first memory transistor, and
    wherein the first dummy transistor is not a transistor included in a memory cell, and the voltage applied to the first dummy word line in order to write data into the first memory cell is lower than the voltage applied to the first control gate line.

7. The semiconductor memory device according to claim 6,
    wherein the voltage control circuit includes:
        a first selection circuit that selects either one of a first supply voltage circuit and a first current source circuit and couples the selected circuit to the first bit line;
        a second selection circuit that selects either one of a second supply voltage circuit and the first current source circuit and couples the selected circuit to the second bit line, the second supply voltage circuit generating the same level of voltage as the first supply voltage circuit; and
        a third supply voltage circuit that applies, to the first dummy transistor, the same amount of current as is generated by the first current source circuit, and
    wherein, when data is to be written into the first memory cell, the voltage control circuit causes the first selection circuit to select the first current source circuit and causes the second selection circuit to select the second supply voltage circuit.

8. A semiconductor memory device comprising:
    a first memory cell having a first transistor that is coupled to a first word line, a first source line, and a first bit line;
    a second memory cell having a second transistor that is coupled to a second word line, a second source line, and the first bit line; and a voltage control circuit that, when data is to be written into the first memory cell, couples the first bit line to the second source line.

9. The semiconductor memory device according to claim 8, further comprising:
a third memory cell having a third transistor that is coupled to the first word line, the first source line, and a second bit line,
wherein, when data is to be written into the third memory cell and not into the first memory cell, the voltage control circuit uncouples the first bit line from the second source line and couples the second bit line to the second source line.

10. The semiconductor memory device according to claim 9,
wherein the voltage control circuit includes:
a first selection circuit that selects either one of a first supply voltage circuit and a first current source circuit and couples the selected circuit to the first bit line;
a second selection circuit that selects either one of a second supply voltage circuit and a second current source circuit and couples the selected circuit to the second bit line, the second supply voltage circuit generating the same level of voltage as the first supply voltage circuit, the second current source circuit generating the same amount of current as the first current source circuit;
a first switch circuit that changes the coupling state between a first signal line and the second source line, the first signal line being coupled to the first bit line and the first current source circuit when the first current source circuit is selected by the first selection circuit; and
a second switch circuit that changes the coupling state between a second signal line and the second source line, the second signal line being coupled to the second bit line and the second current source circuit when the first current source circuit is selected by the second selection circuit,
wherein, when data is to be written into the first memory cell, the voltage control circuit causes the first selection circuit to select the first current source circuit, causes the second selection circuit to select the second supply voltage circuit, causes the first switch circuit to couple the first signal line to the second source line, and causes the second switch circuit to uncouple the second signal line from the second source line.

* * * * *